US007217498B2

(12) United States Patent
Kawauchi et al.

(10) Patent No.: US 7,217,498 B2
(45) Date of Patent: May 15, 2007

(54) HEAT-SENSITIVE LITHOGRAPHIC PRINTING PLATE PRECURSOR

(75) Inventors: Ikuo Kawauchi, Shizuoka (JP); Ippei Nakamura, Shizuoka (JP); Mitsumasa Tsuchiya, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 52 days.

(21) Appl. No.: 10/743,441

(22) Filed: Dec. 23, 2003

(65) Prior Publication Data

US 2004/0137366 A1 Jul. 15, 2004

(30) Foreign Application Priority Data

Dec. 27, 2002 (JP) .......................... P.2002-382231
Jan. 29, 2003 (JP) .......................... P.2003-020750

(51) Int. Cl.
*G03C 1/77* (2006.01)
*G03F 7/038* (2006.01)
*G03F 7/095* (2006.01)

(52) U.S. Cl. .............................. 430/273.1; 430/271.1; 430/275.1; 430/278.1; 430/302; 430/944; 430/905; 430/910

(58) Field of Classification Search ............ 430/270.1, 430/271.1, 302, 306, 944; 101/453
See application file for complete search history.

(56) References Cited

U.S. PATENT DOCUMENTS

| | | | | |
|---|---|---|---|---|
| 7,074,542 | B2 * | 7/2006 | Aoshima | 430/162 |
| 2003/0165775 | A1 * | 9/2003 | Endo et al. | 430/278.1 |
| 2004/0063036 | A1 * | 4/2004 | Takamiya | 430/302 |

FOREIGN PATENT DOCUMENTS

| | | | |
|---|---|---|---|
| EP | 1176467 | A1 * | 1/2002 |
| JP | 7-285275 | A | 10/1995 |
| JP | 10-250255 | A | 9/1998 |
| JP | 11-44956 | A | 2/1999 |
| JP | 2002-251003 | A | 9/2002 |
| WO | WO 97/39894 | | 10/1997 |

* cited by examiner

*Primary Examiner*—Sin Lee
(74) *Attorney, Agent, or Firm*—Sughrue Mion, PLLC

(57) ABSTRACT

A heat-sensitive lithographic printing plate precursor comprising a support having thereon two image-forming layers each containing a polymer insoluble in water and soluble in an aqueous alkaline solution, wherein an upper layer of the image-forming layers contains a copolymer including a monomer unit represented by formula (A) defined in the specification.

3 Claims, No Drawings

HEAT-SENSITIVE LITHOGRAPHIC PRINTING PLATE PRECURSOR

FIELD OF THE INVENTION

The present invention relates to an image-recording material capable of being used as an offset printing plate precursor. More particularly, it relates to a heat-sensitive lithographic printing plate precursor for a so-called direct plate-making, which is capable of producing a printing plate directly from digital data of a computer or the like.

BACKGROUND OF THE INVENTION

The progress of lasers in recent years has been remarkable and high output and compact devices of solid laser or semiconductor laser having a light emission region in the range of from near infrared to infrared become easily available. The heat-sensitive lithographic printing plate precursor for direct plate-making, which is used such an infrared laser as a light source, is useful because it can be handled in a bright room and is very preferable in the plate-making operation.

As the heat-sensitive lithographic printing plate precursor for direct plate-making, a positive-working heat-sensitive lithographic printing plate precursor having a heat-sensitive layer (an image-forming layer) comprising a binder resin soluble in an aqueous alkali solution and an infrared absorbing dye or the like, which absorbs light to generate heat, is described, for example, in Patent Document 1 (WO 97/39894) and Patent Document 2 (JP-A-11-44956 (the term "JP-A" as used herein means an "unexamined published Japanese patent application")). In the unexposed area of the image-forming layer, the infrared absorbing dye or the like interacts with the binder resin to substantially decreases a solubility of the binder resin. Specifically, the infrared absorbing dye or the like functions as a dissolution inhibiting agent. On the other hand, in the exposed area, the interaction between the infrared absorbing dye or the like and the binder resin is weakened upon the heat generated by the exposure so that the binder resin becomes soluble in an alkali developing solution. Development is conducted using such difference of the solubility between the exposed area and the unexposed area, whereby a lithographic printing plate is prepared.

However, in such a positive-working heat-sensitive lithographic printing plate precursor, there is a problem in that the difference between the dissolution resistance of the unexposed area (image area) to the developing solution and the solubility of the exposed area (non-image area) in the developing solution in various using conditions is yet insufficient, and an excessive development (phenomenon of reduction of film thickness, in which the image layer becomes thin due to the dissolution of the image area) or an inferior development (phenomenon of the occurrence of residual film, in which the non-image area is not completely dissolved and remains) is liable to occur by the fluctuation of the using conditions.

Further, since strength of the image-forming layer is low, there is a problem in that the surface state readily fluctuates, for example, fine scratches are generated even by touching with the surface at the handling, and such slight fluctuation of the surface state, for example, the fine scratches, causes increase of the solubility in the vicinity thereof, as a result, the scratch trace is left in the image area after development, resulting in the occurrence of deterioration of printing durability or inking failure.

Moreover, since the image-forming faculty of heat-developable lithographic printing plate precursor depends upon the heat generation by an infrared laser exposure, there is also a problem that in the vicinity of a support where diffusion of the heat to the support occur, the quantity of heat used for dissolving the image-forming layer is decreased to reduce the difference of solubility between the exposed area and the unexposed area, whereby the reproducibility of highlight becomes insufficient.

Those problems are derived from essential difference in plate-making mechanism between a positive-working heat-sensitive lithographic printing plate precursor and a conventional positive-working photosensitive lithographic printing plate precursor (positive PS plate) for plate-making through UV exposure. Specifically, in the positive PS plate, an image-forming layer contains a binder resin soluble in an aqueous alkali solution and an onium salt or quinonediazide compound. The onium salt or quinonediazide compound performs two functions. One is a function as dissolution inhibiting agent upon interaction with the binder resin in the unexposed area, and the other is a function as dissolution accelerating agent by generating an acid upon decomposition with light in the exposed area.

On the other hand, the infrared absorbing agent or the like contained in the heat-sensitive lithographic printing plate precursor acts only as the dissolution inhibiting agent in the unexposed area, and does not accelerate the dissolution in the exposed area. Therefore, in order to make difference in solubility between the unexposed area and the exposed area in the heat-sensitive lithographic printing plate precursor, it cannot be helped to use as the binder resin a resin essentially having high solubility in an alkali developing solution. Thus, the heat-sensitive lithographic printing plate precursor bears problems in that the reduction of film thickness occurs, in that the scratch resistance is deteriorated and that the states before development are unstable. On the contrary, when the solubility of the binder resin in the alkali developing solution is decreased in order to strengthen the unexposed area, decrease in sensitivity is caused. Accordingly, since the difference in solubility between the unexposed area and the exposed area is small in the heat-sensitive lithographic printing plate precursor, a range of development condition (development latitude) for forming an image by distinguishing of the difference in solubility is narrowly restricted.

Therefore, various investigations have been made to develop a dissolution inhibiting agent having selectivity, which loses the dissolution inhibiting function in the exposed area but maintains the dissolution inhibiting function in the unexposed area. For instance, a technique of adding a light-heat converting agent and a substance that is thermally decomposable and can substantially decrease solubility of the alkali-soluble resin before it is thermally decomposed to a recording layer of positive-working lithographic printing plate precursor for infrared laser is described, for example, in Patent Document 3 (JP-A-7-285275). According to the technique, the dissolution of the recording layer is inhibited and the scratch resistance is improved and on the other hand, in the exposed area the substance thermally decomposable is decomposed by heat generated by the light-heat converting agent to lose the dissolution inhibiting function to the alkali-soluble resin, thereby being capable of increasing the sensitivity.

A heat-sensitive lithographic printing plate precursor comprising a support having thereon a hydrophobic layer containing a polymer soluble in an aqueous alkali solution and an upper layer sensitive to an infrared ray on the hydrophobic layer is described in Patent Document 4 (JP- A-10-250255). The upper layer of the heat-sensitive lithographic printing plate precursor contains carbon black and nitrocellulose or the like. When the heat-sensitive lithographic printing plate precursor is exposed, the upper layer is partially diminished so that the upper layer becomes more permeable to the aqueous alkaline solution. Using the upper layer as a mask, the lower hydrophobic layer is selectively removed upon development to form an image.

Further, it is described in Patent Document 5 (JP-A-2002-251003) that a heat-sensitive lithographic printing plate precursor comprising a lower layer containing a specific water-insoluble and alkali-soluble resin having a sulfonamido group or the like and an upper heat-sensitive layer increasing the solubility in the aqueous alkaline solution upon exposure and containing a water-insoluble and alkali-soluble resin and an infrared absorbing dye exhibits favorable printing durability and development latitude.

However, in such a heat-sensitive lithographic printing plate precursor having an image-forming layer of two-layer type, although the sensitivity can be increased by reducing thickness of the upper heat-sensitive layer, the scratch resistance decreases at the same time. To increase the thickness of upper heat-sensitive layer in order to improve the scratch resistance results in decrease in the sensitivity. Namely, there is a problem of trade-off between the sensitivity and the scratch resistance in the heat-sensitive lithographic printing plate precursor.

Patent Document 1: WO 97/39894

Patent Document 2: JP-A-11-44956

Patent Document 3: JP-A-7-285275

Patent Document 4: JP-A-10-250255

Patent Document 5: JP-A-2002-251003

SUMMARY OF THE INVENTION

An object of the invention is to overcome the problems in the prior art on the heat-sensitive lithographic printing plate precursor for direct plate-making using an infrared laser. More specifically, an object of the invention is to provide a heat-sensitive lithographic printing plate precursor for direct plate-making, which is excellent in scratch resistance and exhibits a broad development latitude.

Other objects of the invention will become apparent from the following description.

As a result of the intensive investigations, it has been found that the above-described objects can be achieved by the following means. Specifically, the invention includes the following heat-sensitive lithographic printing plate precursors.

(1) A heat-sensitive lithographic printing plate precursor comprising a support having thereon two image-forming layers each containing a polymer insoluble in water and soluble in an aqueous alkaline solution, wherein an upper layer of the image-forming layers contains a copolymer including a monomer unit represented by formula (A) shown below.

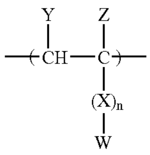

(A)

In formula (A), W represents a carboxy group, X represents a divalent connecting group, Y represents a hydrogen atom or a carboxy group, Z represents a hydrogen atom, an alkyl group or a carboxy group, or W and Z or Y and Z may be combined with each other to from an acid anhydride group of —(CO)—O—(CO)—, and m represents 0 or 1.

(2) The heat-sensitive lithographic printing plate precursor as described in item (1) above, wherein the monomer unit represented by formula (A) is a monomer unit represented by formula (A') shown below.

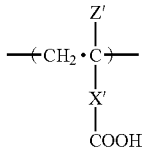

(A')

In formula (A'), Z' represents a hydrogen atom or an alkyl group, and X' represents an arylene group, which may have, a substituent, or any one of the strictures represented by formulae (X1) to (X3) shown below.

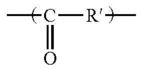

(X1)

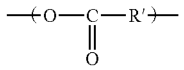

(X2)

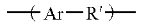

(X3)

In formulae (X1) to (X3), Ar represents an arylene group, which may have a substituent, and R' represents a divalent connecting group.

DETAILED DESCRIPTION OF THE INVENTION

The invention is based on the finding resulting from the intensive investigations that discrimination on development, that is, distinction between the image area and the non-image area, is considerably improved by forming image-forming layers of a two-layer structure each containing a resin insoluble in water and soluble in an aqueous alkaline solution and being incorporated a specific resin soluble in an aqueous alkaline solution into the upper layer. As a result of the increase of the discrimination, significant improvements in the development altitude and scratch resistance can be achieved.

According to the invention, a heat-sensitive lithographic printing plate precursor, which is capable of being subjected to direct plate-making using an infrared laser and excellent in the scratch resistance and exhibits a broad development latitude, can be provided.

The lithographic printing plate precursor of the invention is a positive-working heat-sensitive lithographic printing plate precursor comprising a support having thereon two image-forming layers each containing a polymer insoluble in water and soluble in an aqueous alkaline solution. In the image-forming layers, the exposed area is increased the solubility in an aqueous alkaline solution upon heat generated by the exposure and dissolved out with development processing to form an positive image.

[Image-forming Layer]

(Copolymer Including a Monomer Unit Represented by Formula (A))

The upper image-forming layer (layer far from the support) according to the invention is characterized by containing a copolymer (hereinafter also referred to as copolymer (A) sometimes) including a monomer unit represented by formula (A) shown below.

(A)

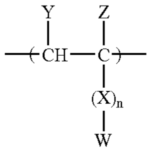

In formula (A), W represents a carboxy group, X represents a divalent connecting group, Y represents a hydrogen atom or a carboxy group, Z represents a hydrogen atom, an alkyl group or a carboxy group, or W and Z or Y and Z may be combined with each other to from an acid anhydride group of —(CO)—O—(CO)—, and m represents 0 or 1.

The divalent connecting group represented by X is not particularly restricted but preferably a single bong, an alkylene group or an arylene group. The alkylene group or arylene group may contain therein or adjacent thereto an ether bond (—O—), a thioether bond (—S—), an ester bond (—COO—) or an amido bond (—CONR— wherein R represents a hydrogen atom or an alkyl group). Among them, a combination of a methylene group with an ether bond or an ester bond is particularly preferred.

The alkyl group represented by Z is preferably an alkyl group having from not more than 5 carbon atoms, more preferably a methyl group.

Examples of monomer capable of forming the monomer unit represented by formula (A) shown above include an α,β-unsaturated carboxylic acid and an α,β-unsaturated carboxylic anhydride, for example, acrylic acid, methacrylic acid, maleic acid, maleic anhydride, itaconic acid or itaconic anhydride.

Of the monomer units represented by formula (A), monomer units represented by formula (A') shown below are preferred.

(A')

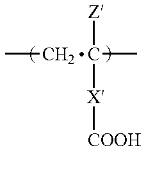

In formula (A'), Z' represents a hydrogen atom or an alkyl group, and X' represents an arylene group, which may have a substituent, or any one of the strictures represented formulae (X1) to (X3) shown below.

(X1)

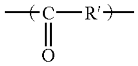

-continued (X2)

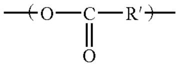

(X3)

$$-(Ar-R')-$$

In formulae (X1) to (X3), Ar represents an arylene group, which may have a substituent, and R' represents a divalent connecting group.

The divalent connecting group represented by R' includes an alkylene group, an arylene group, an imido group and an oxyalkylene group, each of which may have a substituent. Examples of the substituent include an alkyl group, a hydroxy group, an alkoxy group, a halogen atom, a phenyl group, a dimethyamino group, an ethylene oxide group, a vinyl group and an o-carboxybenzoyloxy group.

Specific examples of the monomer corresponding to the repeating unit represented by formula (A') are set forth below, but the invention should not be construed as being limited thereto.

a-1

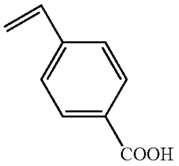

a-2

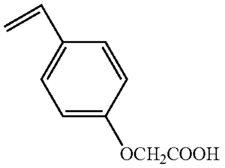

a-3

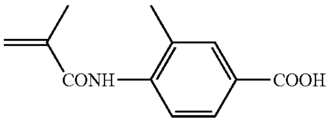

a-4

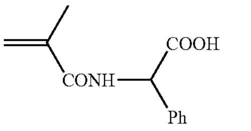

a-5

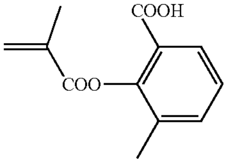

a-6

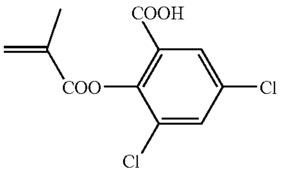

-continued
a-7
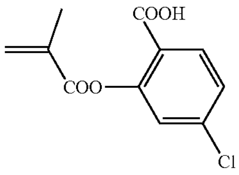
a-8
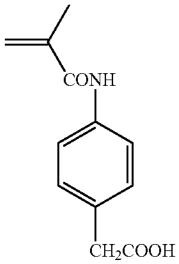
a-9
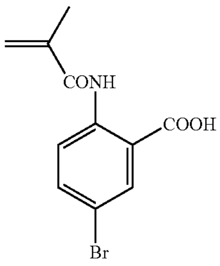
a-10
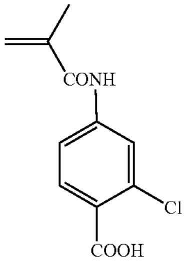
a-11
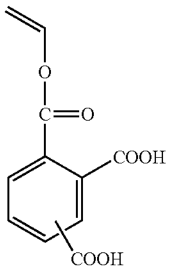
a-12
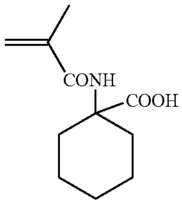
-continued
a-13
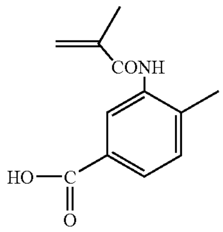
a-14, a-15
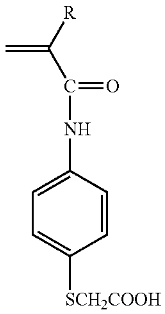
a-14: R = —H, a-15: R = —$CH_3$
a-16
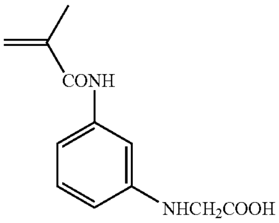
a-17
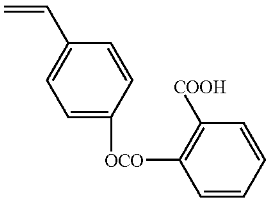
a-18, 19, 20
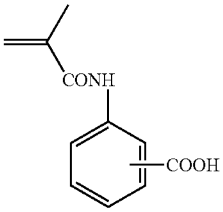
a-18: o-
a-19: m-
a-20: p-
a-21
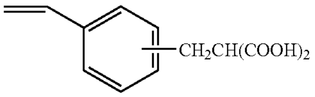

-continued a-22, 23, 24

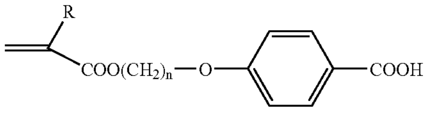

a-22: R = —CH3, n = 4
a-23: R = —CH3, n = 6
a-24: R = —H, n = 6 a-25

a-26

a-27

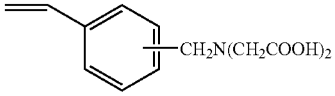

a-28

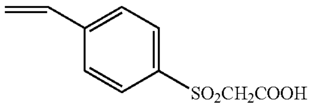

a-29

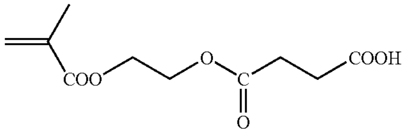

a-30

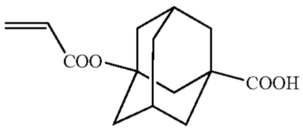

a-31

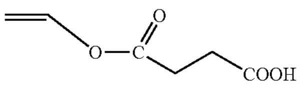

a-32

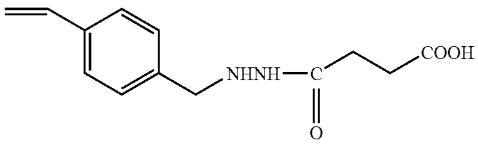

a-33

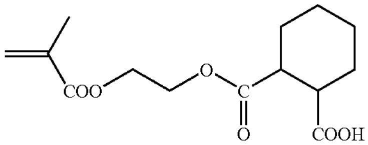

a-34

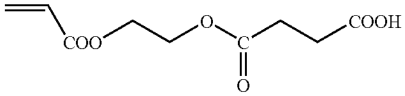

a-35

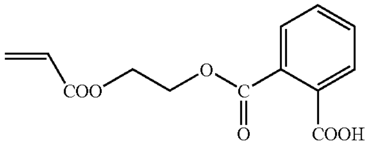

-continued a-36

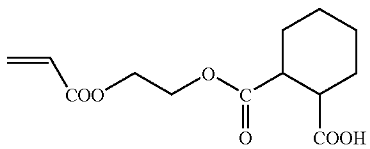

The monomer unit represented by formula (A) is preferably included from 5 to 90% by mole, more preferably from 10 to 80% by mole, and still more preferably from 15 to 70% by mole in Copolymer (A). In such a range, the favorable solubility in an aqueous alkali solution is obtained and the development latitude can be sufficiently improved.

The content of monomer unit represented by formula (A') is preferably from 5 to 90% by mole, more preferably from 10 to 80% by mole, and still more preferably from 15 to 75% by mole in Copolymer (A). In the above-described range, the favorable developing property and ratio of residual film in the unexposed area are obtained.

Examples of other monomer copolymerized with the monomer forming the monomer unit represented by formula (A) include monomers set forth in the following (m1) to (m11), however, the invention should not be construed as being limited thereto.

(m1) Acrylates and methacrylates each having an aliphatic hydroxy group, for example, 2-hydroxyethyl acrylate or 2-hydroxyethyl methacrylate.

(m2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate or N-dimethylaminoethyl acrylate.

(m3) Alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate or N-dimethylaminoethyl methacrylate.

(m4) Acrylamides and methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(m5) Vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether.

(m6) Vinyl esters, for example, vinyl acetate, vinyl chloroacetate, vinyl butyrate or vinyl benzoate.

(m7) Styrenes, for example, styrene, α-methylstyrene, methylstyrene or chloromethylstyrene.

(m8) Vinyl ketones, for example, methyl vinyl ketone, ethyl vinyl ketone, propyl vinyl ketone or phenyl vinyl ketone.

(m9) Olefins, for example, ethylene, propylene, isobutylene, butadiene or isoprene.

(m10) N-vinylpyrrolidone, N-vinylcarbazol, 4-vinylpyridine, acrylonitrile or methacrylo-nitrile.

(m11) Unsaturated imides, for example, maleimide, N-acryloylacrylamide, N-acetylmethacrylamide, N-propionylmethacrylamide or N-(p-chlorobenzoyl)methacrylamide.

The copolymerizable monomer component preferably includes a (meth)acrylate, a (meth)acrylamide derivative and a styrene derivative. The copolymerizable monomer component may be composed of one kind, or appropriate two kinds or three kinds or more of monomers selected from the (meth)acrylate (meth)acrylamide derivative and styrene derivative. Specifically, the copolymerizable monomer component may be four kinds of monomers in total composed of two kinds of monomers selected from the (meth)acrylate and two kinds of monomers selected from the styrene derivative.

In the specification, acryl and methacryl are collectively referred to as "(meth)acryl". The terminology "include a (meth)acrylate as a copolymer component" as used herein means that at least any one of acrylate and methacrylate is included. The same is also applied to a (meth)acrylamide derivative.

The (meth)acrylate as the copolymerizable monomer component described above includes substituted or unsubstituted alkyl esters and aryl esters. The alkyl group includes, for example, methyl, ethyl, n-propyl, isopropyl, n-butyl, isobutyl, tert-butyl, n-hexyl, n-heptyl, n-octyl and 2-ethylhexyl. The aryl group includes, for example, phenyl, 1-naphthyl, 2-naphthyl and benzyl. The alkyl group or aryl group may have a substituent. Examples of the substituent include a hydroxy group, an alkoxy group, a halogen atom, a phenyl group, a dimethyamino group, an ethylene oxide group, a vinyl group and an o-carboxybenzoyloxy group.

The (meth)acrylate for use in the invention preferably includes methyl acrylate, methyl methacrylate, ethyl methacrylate, isopropyl methacrylate, n-butyl methacrylate.

The (meth)acrylates may be used individually or in combination of two or more thereof in the invention.

The content of the (meth)acrylate is preferably from 0 to 95% by mole, more preferably from 5 to 90% by mole, and still more preferably from 10 to 80% by mole in the copolymer.

The (meth)acrylamide derivative constituting the copolymerizable monomer component according to the invention is not particularly limited as long as it is a derivative of (meth)acrylamide, but preferably a (meth)acrylamide derivative represented by the following formula (c):

(c)

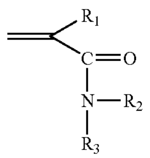

In formula (c), $R_1$ represents a hydrogen atom or an alkyl group. $R_2$ and $R_3$ each independently represent a hydrogen atom, an alkyl group having from 1 to 10 carbon atoms or an aryl group having from 6 to 10 carbon atoms, provided that both $R_2$ and $R_3$ are not hydrogen atoms at the same time.

$R_1$ in formula (c) represents a hydrogen atom or an alkyl group and preferably a hydrogen atom or an alkyl group having from 1 to 4 carbon atoms.

The alkyl group having from 1 to 10 carbon atoms for $R_2$ or $R_3$ includes, for example, methyl, ethyl, n-propyl, n-butyl, isobutyl, tert-butyl, n-hexyl, n-heptyl, n-octyl and 2-ethylhexyl. The aryl group having from 6 to 10 carbon atoms for $R_2$ or $R_3$ includes, for example, phenyl, 1-naphthyl or 2-naphthyl. The alkyl group or aryl group may have a substituent. Examples of the substituent include a hydroxy group, an alkoxy group, a halogen atom, a phenyl group, a dimethyamino group, an ethylene oxide group, a vinyl group and an o-carboxybenzoyloxy group. Both $R_2$ and $R_3$ are not hydrogen atoms at the same time.

Specific examples of the (meth)acrylamide derivative are set forth below, bur the invention should not be construed as being limited thereto.

(c-1) N-tert-Butylacrylamide
(c-2) N-(n-Butoxymethyl)acrylamide
(c-3) N-tert-Butylmethacrylamide
(c-4) N-(1,1-Dimethyl-3-oxobutyl)acrylamide
(c-5) N,N-Dimethylmethacrylamide
(c-6) N,N-Dimethylacrylamide
(c-7) N-Isopropylacrylamide
(c-8) N-Methylmethacrylamide
(c-9) N-Phenylmethacrylamide
(c-10) N-[3-(Dimethylamino)propyl]acrylamide The (meth)acrylamide derivatives may be used individually or in combination of two or more thereof in the copolymerizable monomer component.

The content of the (meth)acrylamide derivative is preferably from 0 to 95% by mole, more preferably from 5 to 90% by mole, and still more preferably from 20 to 80% by mole in the copolymer.

The styrene derivative constituting the copolymerizable monomer component according to the invention is not particularly limited as long as it is a derivative of styrene, but preferably a styrene derivative represented by the following formula (b):

(b)

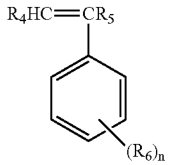

In formula (b), $R_4$, $R_5$ and $R_6$ each independently represent a hydrogen atom or a substituent. n represents an integer of from 1 to 5. The substituent for $R_4$, $R_5$ or $R_6$ is not particularly limited and includes an alkyl group, an aryl group, a hydroxy group, a carboxy group and a halogen atom.

Specific examples of the styrene derivative are set forth below, bur the invention should not be construed as being limited thereto.

(b-1) 4-Bromostyrene
(b-2) β-Bromostyrene
(b-3) 4-Chloro-α-methylstyrene
(b-4) 3-Chlorostyrene
(b-5) 4-Chlorostyrene
(b-6) 2,6-Dichlorostyrene
(b-7) 2-Fluorostyrene
(b-8) 3-Fluorostyrene
(b-9) 4-Fluorostyrene
(b-10) Methylstyrene (b-11) Vinyltoluene (b-12) trans-β-Methylstyrene b-13

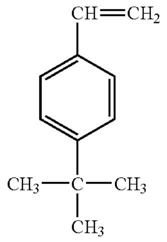

b-14

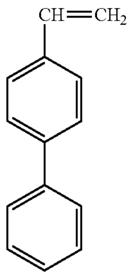

b-15

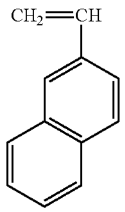

b-16

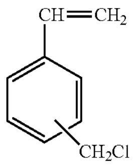

b-17

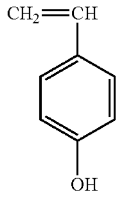

Besides the above examples, the styrene derivative includes, for example, styrene, vinyl benzoate, methyl vinyl benzoate, hydroxymethylstyrene, sodium p-styrenesulfonate, potassium p-styrenesulfinate, p-aminomethylstyrene and 1,4-divinylbenzene. The styrene derivatives may be used individually or in combination of two or more thereof in the copolymerizable monomer component.

The content of the styrene derivative is preferably from 0 to 95% by mole, more preferably from 5 to 90% by mole, and still more preferably from 20 to 80% by mole in the copolymer.

The copolymer obtained from the monomer of formula (A) and the copolymerizable monomer component itself brings about preferable physical properties, for example, preferable development latitude. By further copolymerization of a third copolymerizable monomer component, other various physical properties can be improved or modified.

Such other various physical properties include, for example, chemical resistance, printing durability, sensitivity and developing property. Examples of the third copolymerizable monomer component include acrylonitrile, maleimide, vinyl acetate and N-vinylpyrrolidone.

The weight average molecular weight of the copolymer for use in the invention is preferably from 5,000 to 200,000, more preferably from 10,000 to 120,000, and particularly preferably from 20,000 to 80,000. In the above range of the weight average molecular weight, the sufficient film-forming property and favorable development property are obtained.

As a copolymerization method for forming the copolymer, for example, a conventionally known graft copolymerization method, block copolymerization method or random copolymerization method can be used.

The content of the copolymer including the monomer unit represented by formula (A) is preferably from 1 to 40% by weight, and more preferably from 2 to 30% by weight based on the total solid content of the upper layer. The content more than 40% by weight is not preferred because the effect of increasing printing durability due to burning treatment is lowered.

The upper layer according to the invention contains as the essential component the copolymer including the monomer unit represented by formula (A) and may further contain other alkali-soluble resin. The alkali-soluble resin included in the upper layer is described below. The alkali-soluble resin can also be used as an alkali-soluble resin for a layer (lower layer) close to the support. It is possible to incorporate the copolymer including the monomer unit represented by formula (A) into the lower layer as the alkali-soluble resin. In such a case, however, it is preferred that the addition ratio of the copolymer in the lower layer is lower than the addition ratio of the copolymer in the upper layer.

Copolymers (A) may be used individually or in combination of two or more thereof. With respect to the amount added to the upper image-forming layer, the total content of Copolymer (A) is preferably from 1 to 45% by weight, more preferably from 2 to 30% by weight, and particularly preferably from 3 to 20% by weight based on the total solid content of the upper image-forming layer.

(Polymer Insoluble in Water and Soluble in Aqueous Alkaline Solution)

The polymer insoluble in water and soluble in an aqueous alkaline solution (hereinafter also referred to as an "alkali-soluble polymer" sometimes) for use in the upper image-forming layer and lower image-forming layer includes a homopolymer or copolymer containing an acidic group in the main chain and/or side chain thereof, and a mixture thereof. Accordingly, the upper image-forming layer and lower image-forming layer for use in the invention have a feature of dissolving upon contact with an alkaline developing solution.

The alkali-soluble polymer for use in the image-forming layer is not particularly limited and conventionally known alkali-soluble polymer can be used. A polymer compound having any one functional group of (1) a phenolic hydroxy group, (2) a sulfonamido group and (3) an active imido group in its molecule is preferred.

Examples of the polymer compound include those described below, but the invention should not be construed as being limited thereto.

(1) Examples of the polymer compound having a phenolic hydroxy group include novolak resins, for example, phenol formaldehyde resin, m-cresol formaldehyde resin, p-cresol formaldehyde resin, m-/p-mixed cresol formaldehyde resin and phenol/cresol (the cresol may be any one of m-cresol, p-cresol and m-/p-mixed cresol) mixed formaldehyde resin, and pyrogallol acetone resins.

A polymer compound having a phenolic hydroxy group in its side chain is also exemplified as the polymer compound having a phenolic hydroxy group. Examples of the polymer compound having a phenolic hydroxy group in its side chain include polymer compounds obtained by homopolymerization of a polymerizable monomer of a low molecular compound having one or more phenolic hydroxy groups and one or more polymerizable unsaturated bonds, or copolymerization of such a monomer with other polymerizable monomer.

Examples of the polymerizable monomer having a phenolic hydroxy group used for obtaining the polymer compound having a phenolic hydroxy group include an acrylamide, a methacrylamide, an acrylate and a methacrylate each having a phenolic hydroxy group and a hydroxystyrene. Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate are preferably used.

The resins having a phenolic hydroxy group may be used in combination of two or more thereof. In addition, a condensation polymerization product of a phenol containing as a substituent an alkyl group having from 3 to 8 carbon atoms with formaldehyde, for example, tert-butylphenol formaldehyde resin or octylphenol formaldehyde resin described in U.S. Pat. No. 4,123,279 may be used together.

(2) Examples of the alkali-soluble polymer compound having a sulfonamido group include polymer compounds obtained by homopolymerization of a polymerizable monomer having a sulfonamido group, or copolymerization of such a monomer with other polymerizable monomer. Examples of the polymerizable monomer having a sulfonamido group include a polymerizable monomer of a low molecular compound having one or more sulfonamido groups having at least one hydrogen atom bonded on the nitrogen atom thereof, which is represented by —NH—$SO_2$—, and one or more polymerizable unsaturated bonds. Among them, low molecular compounds having both an acryloyl group, an allyl group or a vinyloxy group and an unsubstituted or mono-substituted aminosulfonyl group or a substituted sulfonylimino group are preferred.

Specific examples thereof include the compounds described in JP-B-7-69605 (the term "JP-B" as used herein means an "examined Japanese patent publication"). Among them, for example, 3-aminosulfonylphenyl methacrylate and N-(4-aminosulfonylphenylmethacrylamide are preferably used.

(3) The alkali-soluble polymer compound having an active imido group preferably has the active imido group in its molecule. Examples of the polymer compound include polymer compounds obtained by homopolymerization of a polymerizable monomer of a low molecular compound having one or more active imido groups and one or more polymerizable unsaturated bonds in its molecule, or copolymerizing such a monomer with other polymerizable monomer.

Specific examples of such a monomer, which can be favorably used, include N-(p-toluenesulfonyl)methacrylamide and N-(p-toluenesulfonyl)acrylamide.

Examples of the monomer component copolymerized with the polymerizable monomer having a phenolic hydroxy group, the polymerizable monomer having a sulfonamido group or the polymerizable monomer having an active imido group include compounds set forth in the following (n1) to (n12), however, the invention should not be construed as being limited thereto.

(n1) Acrylates and methacrylates each having an aliphatic hydroxy group, for example, 2-hydroxyethyl acrylate or 2-hydroxyethyl methacrylate.

(n2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate or glycidyl acrylate.

(n3) Alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate or glycidyl methacrylate.

(n4) Acrylamides and methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(n5) Vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether.

(n6) Vinyl esters, for example, vinyl acetate, vinyl chloroacetate, vinyl butyrate or vinyl benzoate.

(n7) Styrenes, for example, styrene, $\alpha$-methylstyrene, methylstyrene or chloromethylstyrene.

(n8) Vinyl ketones, for example, methyl vinyl ketone, ethyl vinyl ketone, propyl vinyl ketone or phenyl vinyl ketone.

(n9) Olefins, for example, ethylene, propylene, isobutylene, butadiene or isoprene.

(n10) N-vinylpyrrolidone, acrylonitrile or methacrylo-nitrile.

(n11) Unsaturated imides, for example, maleimide, N-acryloylacrylamide, N-acetylmethacrylamide, N-propionylmethacrylamide or N-(p-chlorobenzoyl)methacrylamide.

(n12) Unsaturated carboxylic acids, for example, acrylic acid, methacrylic acid, maleic anhydride or itaconic acid.

In the invention, when the alkali-soluble polymer is a homopolymer or copolymer of the polymerizable monomer having a phenolic hydroxy group, the polymerizable monomer having a sulfonamido group or the polymerizable monomer having an active imido group, the polymer has preferably a weight average molecular weight of not less than 2,000 and a number average molecular weight of not less than 500, and more preferably a weight average molecular weight of from 5,000 to 300,000, a number average molecular weight of from 800 to 250,000 and a dispersion degree (weight average molecular weight/number average molecular weight) of from 1.1 to 10.

In the invention, when the alkali-soluble polymer is a resin, for example, phenol formaldehyde resin or cresol formaldehyde resin, the polymer preferably has a weight average molecular weight of from 500 to 20,000 and a number average molecular weight of from 200 to 10,000.

The alkali-soluble resin for use in the upper image-forming layer is preferably a resin having a phenolic hydroxy group because in such a resin strong hydrogen bonds are formed in the unexposed area and the hydrogen bonds are partially resolved easily in the exposed area. Among them, a novolak resin is particularly preferably used.

It is also preferred that an acrylic resin having a low compatibility with the resin having a phenolic hydroxy group is further used in combination as a still another kind of the alkali-soluble resin. Examples of the acrylic resin having a low compatibility with the resin having a phenolic hydroxy group include acrylic resins having a sulfonamido group. In the case of using two or more kinds of the alkali-soluble polymers are used in mixture, a mixing ratio thereof can be appropriately selected. It is preferred, however, that the content of the alkali-soluble polymer compound having a phenolic hydroxy group is not less than 60% by weight based on the total alkali-soluble polymer compound.

The amount of the alkali-soluble polymer compound added to the upper image-forming layer is preferably from 50 to 90% by weight in total. In such a range, the favorable durability and sensitivity can be obtained.

Two kinds of the alkali-soluble polymer compounds having different dissolution speeds in an aqueous alkaline solution may also be used in an appropriate mixing ratio.

Preferably, the alkali-soluble polymer compound having a phenolic hydroxy group, which forms strong hydrogen bonds in the unexposed area and the hydrogen bonds are partially resolved easily in the exposed area, is used in an amount of from 60 to 99.8% by weight based on the total alkali-soluble polymer compound.

When the amount of the alkali-soluble polymer compound having a phenolic hydroxy group is less than 60% by weight, the image-forming property is deteriorated. On the other hand, when it is more than 99.8% by weight, the effects of the invention is not expected.

The alkali-soluble polymer for use in the lower image-forming layer can be selected individually or in combination of two or more from the above-described alkali-soluble polymers. Of the alkali-soluble polymers, acrylic resins are preferably used. Of the acrylic resins, those having a sulfonamido group are particularly preferred.

(Infrared Absorbing Dye)

Into the image-forming layer according to the invention, an infrared absorbing dye can be incorporated for the purpose of promoting the efficiencies of light absorption and light-heat conversion, thereby increasing the sensitivity.

The infrared absorbing dye for use in the invention is not particularly limited as long as it is a dye capable of absorbing infrared light to generate heat, and various kinds of dyes known as infrared absorbing dyes can be used.

Examples of the infrared absorbing dye, which can be used in the invention, include commercially available dyes and known dyes described in literature, for example, Yuki Gosei Kagaku Kyokai ed., *Senryo Binran* (*Handbook of Dyes*) (1970). Specific examples thereof include dyes, for example, azo dyes, metal complex salt azo dyes, pyrazolone azo dyes, anthraquinone dyes, phthalocyanine dyes, carbonium dyes, quinonimine dyes, methine dyes and cyanine dyes. Of these dyes, those absorbing infrared or near infrared light are particularly preferred in the invention, because they are suitable for use with a laser emitting infrared or near infrared light.

Examples of the dye absorbing infrared or near infrared light include cyanine dyes described in JP-A-58-125246, JP-A-59-84356, JP-A-60-78787 and U.S. Pat. No. 4,973,572, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792 and cyanine dyes described in British Patent 434,875.

Other examples of the dye preferably used include near infrared absorbing sensitizers described in U.S. Pat. No. 5,156,938, substituted arylbenzo(thio)pyrylium salts described in U.S. Pat. No. 3,881,924, trimethinethiapyrylium salts described in JP-A-57-142645, pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds described in JP-B-5-13514 and JP-B-5-19702, near infrared absorbing dyes represented by formulae (I) and (II) in U.S. Pat. No. 4,765,993, and commercially available products, for example, Epolight III-178, Epolight III-130 or Epolight III-125 (manufactured by Epolin Inc.).

The infrared absorbing dye can be added not only to the upper image-forming layer but also to the lower image-forming layer. BY adding the infrared absorbing dye to the lower image-forming layer, the lower image-forming layer can also function as an infrared-sensitive layer. In the case of adding the infrared absorbing dye to the lower image-forming layer, the infrared absorbing dye may be the same as or different from the infrared absorbing dye added to the upper image-forming layer.

Also, the infrared absorbing dye may be added to a layer different from the image-forming layer. As the different layer, a layer adjacent to the image-forming layer is preferred.

The amount of the infrared absorbing dye added to the upper image-forming layer is ordinarily from 0.01 to 50% by weight, preferably from 0.1 to 30% by weight, and particularly preferably from 1.0 to 30% by weight based on the total solid content of the upper image-forming layer. In such a range, the favorable sensitivity can be obtained without damaging the uniformity and durability of upper image-forming layer.

The amount of the infrared absorbing dye added to the lower image-forming layer is preferably from 0 to 20% by weight, more preferably from 0 to 10% by weight, and particularly preferably from 0 to 5% by weight based on the total solid content of the lower image-forming layer. However, since diffusion of heat to a support occurs in a region having a thickness of from 0.2 to 0.3 μm in the vicinity of the support, the addition of the infrared absorbing dye to the lower image-forming layer does not brings about the improvement in solubility due to the heat generated by the exposure but the solubility decreases due to difficulty in dissolution of the infrared absorbing dye itself, resulting in the decrease in sensitivity. Therefore, it is preferred that the amount added is within the tolerance limit of the solubility decrease. Specifically, the amount is preferably controlled so that the dissolution speed of the lower image-forming layer is not less than 30 nm/second.

(Other Additives)

In the formation of the lower and upper positive-working image-forming layers, various additives can be added in addition to the above-described components as long as the effects of the invention are not impaired. The additive may be incorporated only into the lower image-forming layer, only into the upper image-forming layer, or into both layers, if desired. Examples of the additives are described below.

(Dissolution Inhibiting Compound)

The heat-sensitive lithographic printing plate precursor of the invention can contain a variety of dissolution inhibiting compounds (inhibitors) in the image-forming layer thereof for the purpose of increasing the dissolution inhibition (inhibition) thereof.

The inhibitor is not particularly limited and includes, for example, a quaternary ammonium salt and a polyethylene glycol compound.

The quaternary ammonium salt used is not particularly restricted and includes tetraalkylammonium salts, trialkylarylammonium salts, dialkyldiarylammonium salts, alkyltriarylammonium salts, tetraarylammonium salts, cyclic ammonium salts and bicyclic ammonium salts.

Specific examples of the quaternary ammonium salt include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyltrimethylammonium bromide and N-methylpyridinium bromide. Particularly, quaternary ammonium salts described in JP-A-2003-107688 and JP-A-2003-167332 are preferably used.

The amount of the quaternary ammonium salt added is preferably from 0.01 to 20% by weight, and more preferably from 0.1 to 10% by weight based on the total solid content of the image-forming layer. In such a range, the favorable dissolution inhibiting effect can be obtained. The addition thereof in an amount exceeding 20% by weight may apt to exert a bad influence upon the film-forming property of the binder.

The polyethylene glycol compound used is not particularly restricted and examples thereof include compounds having a structure represented by the following formula:

$$R^1—[O—(R^3—O)_m—R^2]_n$$

wherein $R^1$ represents a polyhydric alcohol residue or a polyhydric phenol residue, $R^2$ represents a hydrogen atom, an alkyl group having from 1 to 25 carbon atoms, an alkenyl group, an alkynyl group, an alkyloyl group, an aryl group or an aryloyl group, each of which may have a substituent, $R^3$ represents an alkylene group, which may have a substituent, m represents a number of not less than 10 on the average, and n represents an integer of from 1 to 4.

Examples of the polyethylene glycol compound having the structure represented by the formula described above include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkyl aryl ethers, polypropylene glycol alkyl aryl ethers, polyethylene glycol glycerol esters, polypropylene glycol glycerol esters, polyethylene glycol sorbitol esters, polypropylene glycol sorbitol esters, polyethylene glycol fatty acid esters, polypropylene glycol fatty acid esters, polyethylene glycolated ethylenediamines, polypropylene glycolated ethylenediamines, polyethylene glycolated diethylenetriamines and polypropylene glycolated diethylenetriamines.

Specific examples thereof include polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, propylene glycol dimethyl ether, propylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic acid ester, polyethylene glycol lauryl ester, polyethylene glycol dilauryl ester, polyethylene glycol nonylic acid ester, polyethylene glycol cetylic acid ester, polyethylene glycol stearoyl ester, polyethylene glycol distearoyl ester, polyethylene glycol behenic acid ester, polyethylene glycol dibehenic acid ester, polypropylene glycol acetyl ester, polypropylene glycol diacetyl ester, polypropylene glycol benzoic acid ester, propylene glycol dibenzoic acid ester, polypropylene glycol lauric acid ester, polypropylene glycol dilauric acid ester, polypropylene glycol nonylic acid ester, polyethylene glycol glycerol ether, polypropylene glycol glycerol ether, polyethylene glycol sorbitol ether, polypropylene glycol sorbitol ether, polyethylene glycolated ethylenediamine, polypropylene glycolated ethylenediamine, polyethylene glycolated diethylenetriamine, polypropylene glycolated diethylenetriamine and polyethylene glycolated pentamethylenehexamine.

The amount of the polyethylene glycol compound added is preferably from 0.01 to 20% by weight, and more preferably from 0.1 to 10% by weight based on the total solid content of the image-forming layer. In such a range, the favorable dissolution inhibiting effect can be obtained without adverse affect on the image-forming property.

When the above-describe inhibition strengthening measure is conducted, the sensitivity may decrease. In such a case, the addition of lactone compound is effective. It is believed that the lactone compound reacts with a developing solution, when the developing solution penetrates into the exposed area, to newly generate a carboxylic acid compound, which contributes to the dissolution of the exposed area, thereby increasing the sensitivity.

The lactone compound used is not particularly restricted and includes compounds represented by the following formulae (L-I) and (L-II):

(L-I)

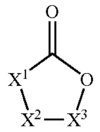

(L-II)

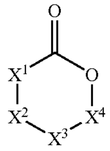

In formulae (L-I) and (L-II), $X^1$, $X^2$, $X^3$ and $X^4$ each represents an atom or an atomic group constituting a ring, which may be the same or different and may have a substituent, provided that at least one of $X^1$, $X^2$ and $X^3$ in formula (L-I) and at least one of $X^1$, $X^2$, $X^3$ and $X^4$ in formula (L-II) each have an electron-withdrawing substituent or a substituent substituted with an electron-withdrawing group.

The atom or atomic group constituting a ring represented by $X^1$, $X^2$, $X^3$ and $X^4$ is a non-metallic atom having two single bonds for forming a ring or an atomic group containing the non-metallic atom.

The non-metallic atom or non-metallic atom-containing group is preferably an atom or an atomic group selected from a methylene group, a sulfinyl group, a carbonyl group, a thiocarbonyl group, a sulfonyl group, a sulfur atom, an oxygen atom and a selenium atom, and more preferably an atomic group selected from a methylene group, a carbonyl group or a sulfonyl group.

At least one of $X^1$, $X^2$ and $X^3$ in formula (L-I) and at least one of $X^1$, $X^2$, $X^3$ and $X^4$ in formula (L-II) each have an electron-withdrawing substituent. The term "electron-withdrawing substituent" as used herein means a group, which has a Hammett's substituent constant σp of a positive value. With respect to the Hammett's substituent constant, for example, *Journal of Medicinal Chemistry*, Vol. 16, No. 11, pages 1207 to 1216 (1973) can be referred to. Examples of the electron-withdrawing substituent having the Hammett's substituent constant σp of a positive value include a halogen atom (for example, a fluorine atom (σp value: 0.06), a chlorine atom (σp value: 0.23), a bromine atom (σp value: 0.23) or an iodine atom (σp value: 0.18)), a trihaloalkyl group (for example, a tribromomethyl group (σp value: 0.29), a trichloromethyl group (σp value: 0.33) or a trifluoromethyl group (σp value: 0.54)), a cyano group (σp value: 0.66), a nitro group (σp value: 0.78), an alphatic, aryl or heterocyclic sulfonyl group (for example, a methanesulfonyl group (σp value: 0.72)), an aliphatic, aryl or heterocyclic acyl group (for example, an acetyl group (σp value: 0.50) or a benzoyl group (σp value: 0.43)), an alkynyl group (for example, an ethynyl group (σp value: 0.23)), an aliphatic, aryl or heterocyclic oxycarbonyl group (for example, a methoxycarbonyl group (σp value: 0.45) or a phenoxycarbonyl group (σp value: 0.44), a carbamoyl group (σp value: 0.36), a sulfamoyl group (σp value: 0.57), a sulfoxido group, a heterocyclic group, an oxo group and a phosphoryl group.

Preferred examples of the electron-withdrawing group include an amido group, an azo group, a nitro group, a nitrile group, an alkoxycarbonyl group having from 1 to 5 carbon atoms, an acyl group having from 1 to 5 carbon atoms, an alkylsulfonyl group having from 1 to 9 carbon atoms, an arylsulfonyl group having from 6 to 9 carbon atoms, an alkylsulfinyl group having from 1 to 9 carbon atoms, an arylsulfinyl group having from 6 to 9 carbon atoms, an arylcarbonyl group having from 6 to 9 carbon atoms, a thiocarbonyl group, a fluorine-containing alkyl group having from 1 to 9 carbon atoms, a fluorine-containing aryl group having from 6 to 9 carbon atoms, a fluorine-containing alkenyl group having from 3 to 9 carbon atoms, an oxo group and a halogen atom.

More preferred examples of the electron-withdrawing group include a nitro group, a fluoroalkyl group having from 1 to 5 carbon atoms, a nitrile group, an alkoxycarbonyl group having from 1 to 5 carbon atoms, an acyl group having from 1 to 5 carbon atoms, an arylsulfonyl group having from 6 to 9 carbon atoms, an arylcarbonyl group having from 6 to 9 carbon atoms, an oxo group and a halogen atom.

Specific examples of the lactone compound represented by formula (L-I) or (L-II) are set forth below, but the invention should not be construed as being limited thereto.

(LI-1)

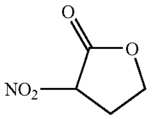

(LI-2)

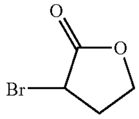

(LI-3)

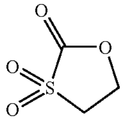

(LI-4)

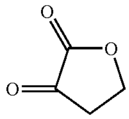

(LI-5)

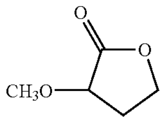

(LI-6)

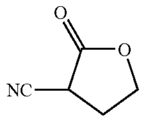

(LI-7)

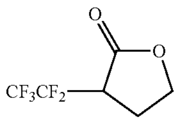

(LI-8)

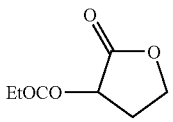

-continued (LI-9)

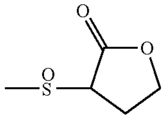

(LI-10)

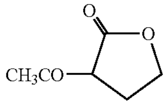

(LI-11)

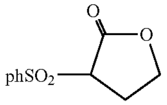

(LI-12)

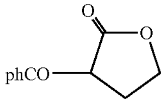

(LI-13)

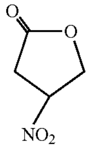

(LI-14)

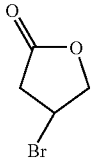

(LI-15)

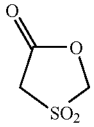

(LI-16)

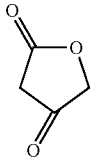

(LI-17)

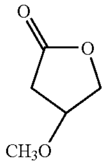

(LI-18)

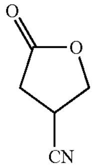

-continued (LI-19)

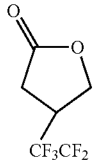

(LI-20)

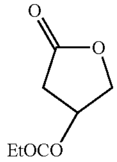

(LI-21)

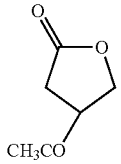

(LI-22)

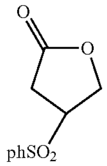

(LI-23)

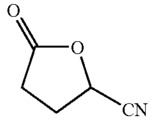

(LI-24)

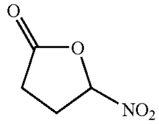

(LII-1)

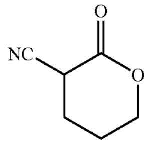

(LII-2)

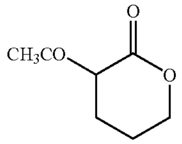

The amount of the lactone compound represented by formula (L-I) or (L-II) added is from 0.1 to 50% by weight, and preferably from 1 to 30% by weight based on the total solid content of the image-forming layer. When the amount is less than 0.1% by weight, the effect is small. When the amount is higher than 50% by weight, the image-forming property may be deteriorated.

The lactone compounds may be used individually or in combination of two or more thereof. Two or more of the compounds represented by formula (L-I) or two or more of the compounds represented by formula (L-II) may be used in an appropriate proportion as long as the total amount thereof is within the range described above.

It is also preferred that a substance that is thermally decomposable and can substantially decrease solubility of the alkali-soluble resin before being thermally decomposed is incorporated into the heat-sensitive lithographic printing plate precursor of the invention in view of further enlargement of the difference of solubility between the exposed area and unexposed area.

The substance that is thermally decomposable and can substantially decrease solubility of the alkali-soluble resin before being thermally decomposed is not particularly restricted and examples thereof include various kinds of onium salts, quinonediazide compounds, aromatic sulfone compounds and aromatic sulfonic acid ester compounds. In view of the thermal decomposing property, the onium salts are preferably used.

Examples of the onium salt include diazonium salts, ammonium salts, phosphonium salts, iodonium salts, sulfonium salts, selenonium salts and arsonium salts. Preferred examples of the onium salt for use in the invention include diazonium salts described in S. I. Schlesinger, *Photogr. Sci. Eng.,* 18, 387 (1974), T. S. Bal et al., *Polymer,* 21, 423 (1980) and JP-A-5-158230, ammonium salts described in U.S. Pat. Nos. 4,069,055 and 4,069,056, phosphonium salts described in D. C. Necker et al., *Macromolecules,* 17, 2468 (1984), C. S. Wen et al., *Teh, Proc. Conf. Rad. Curing ASIA*, p. 478, Tokyo, October (1988) and U.S. Pat. Nos. 4,069,055 and 4,069,056, iodonium salts described in J. V. Crivello et al., *Macromolecules,* 10 (6), 1307 (1977), *Chem. & Eng. News*, p. 31, Nov. 28 (1988), European Patent 104,143, U.S. Pat. Nos. 339,049 and 410,201, JP-A-2-150848 and JP-A-2-296514, sulfonium salts described in J. V. Crivello et al., *Polymer J.,* 17, 73 (1985), J. V. Crivello et al., *J. Org. Chem.*, 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 3,902,114, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, October (1988).

Among the onium salts, diazonium salts are particularly preferred. Particularly preferred examples of the diazonium salt include those described in JP-A-5-158230.

Examples of the counter ion of the onium salt include anions formed from tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and p-toluenesulfonic acid. Among these compounds, hexafluorophosphate and an alkylaromatic sulfonate, for example, triisopropylnaphthalenesulfonate or 2,5-dimethylbenzenesulfonate are preferred.

The amount of the onium salt added is preferably from 0.1 to 50% by weight, more preferably from 0.1 to 30% by weight, and particularly preferably from 0.3 to 30% by weight based on the total solid content of the image-forming layer.

Preferred examples of the quinonediazide compound include o-quinonediazide compounds. The o-quinonediazide compound for use in the invention is a compound having at least one o-quinonediazido group, which increases the alkali solubility upon thermal decomposition, and compounds having various structures can be used. Specifically, o-quinonediazide assists dissolution of the image-forming layer by its two effects, namely, the o-quinonediazide loses the capability of inhibiting the dissolution of the alkali-soluble resin upon thermal decomposition and the o-quinonediazide itself changes into an alkali-soluble substance. Examples of the o-quinonediazide compound, which can be used in the invention, include compounds described in J. Kosar, *Light-Sensitive Systems*, pages 339 to 352, John Wiley & Sons, Inc. In particular, sulfonic acid esters or sulfonic acid amides of o-quinonediazide, obtained by reacting with various aromatic polyhydroxy compounds or aromatic amino compounds, are preferred. Also, ester of benzoquinone-(1,2)-diazidosulfonic chloride or naphthoquinone-(1,2)-diazido-5-sulfonic chloride with a pyrogallol-acetone resin described in JP-B-43-28403, and ester of benzoquinone-(1,2)-diazidosulfonic chloride or naphthoquinone-(1,2)-diazido-5-sulfonic chloride with a phenol formaldehyde resin described in U.S. Pat. Nos. 3,046,120 and 3,188,210 are preferably used.

Furthermore, ester of naphthoquinone-(1,2)-diazido-4-sulfonic chloride with a phenol formaldehyde resin or cresol formaldehyde resin, and ester of naphthoquinone-(1,2)-diazido-4-sulfonic chloride with a pyrogallol-acetone resin are also preferably used. Other useful o-quinonediazide compounds are described in a large number of patents, for example, JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932 and German Patent 854,890.

The amount of the o-quinonediazide compound added is preferably from 1 to 50% by weight, more preferably from 5 to 30% by weight, and particularly preferably from 10 to 30% by weight based on the total solid content of the image-forming layer.

The substances that are thermally decomposable and can substantially decrease solubility of the alkali-soluble resin before being thermally decomposed may be used individually or as a mixture of a plurality of the compounds.

Moreover, for the purpose of intensifying dissolution inhibiting property and strengthening resistance to scratches on the surface of the image-forming layer, polymer containing as a polymerization component, a (meth)acrylate monomer unit having two or three perfluoroalkyl groups each having from 3 to 20 carbon atoms in its molecule described in JP-A-2000-187318 can be used together.

The amount of the polymer added is preferably from 0.1 to 10% by weight, and more preferably from 0.5 to 5% by weight based on the total solid content of the image-forming layer.

(Development Accelerator)

For the purpose of further increasing the sensitivity, acid anhydrides, phenols or organic acids may be used together in the image-forming layer according to the invention.

Of the acid anhydrides, a cyclic acid anhydride is preferably used. Specific examples of the cyclic acid anhydride, which can be used, include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the noncyclic acid anhydride include acetic anhydride. Examples of the phenol include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acid include sulfonic acids, sulfinic acids, alkylsulfuric acids, phosphonic acids, phosphoric acid esters and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The amount of the acid anhydride, phenol or organic acid is preferably from 0.05 to 20% by weight, more preferably from 0.1 to 15% by weight, and particularly preferably from 0.1 to 10% by weight based on the total solid content of the image-forming layer.

(Surfactant)

For the purposes of improving the coating property and enhancing the stability of processing on development conditions, a nonionic surfactant described in JP-A-62-251740 and JP-A-3-208514, an amphoteric surfactant described in JP-A-59-121044 and JP-A-4-13149, a siloxane compound described in European Patent 950,517, or a copolymer comprising a fluorine-containing monomer described in JP-A-62-170950, JP-A-11-288093 and JP-A-2003-57820 can be added to the upper image-forming layer and/or the lower image-forming layer for use in the invention.

Specific examples of the nonionic surfactant include sorbitan tristearate, sorbitan monopalmitate, sorbitan trioleate, stearic acid monoglyceride and polyoxyethylene nonylphenyl ether. Specific examples of the amphoteric surfactant include alkyldi(aminoethyl)glycine, alkylpolyaminbethylglycine hydrochloride, 2-alkyl-N-carboxyethyl-N-hydroxyethylimidazolinium betaine and N-tetradecyl-N,N-betaine type (for example, Amorgen K, trade name, manufactured by Dai-ich Kogyo Seiyaku Co., Ltd.).

The siloxane compound is preferably a block copolymer of dimethylsiloxane and polyalkylene oxide. Specific examples thereof include polyalkylene oxide-modified silicone, for example, DBE-224, DBE-621, DBE-712, DBP-732, DBP-534 (manufactured by Chisso Corp.) and Tego Glide 100 (manufactured by Tego A.G.).

The amount of the surfactant is preferably from 0.01 to 15% by weight, more preferably from 0.05 to 5% by weight, and still more preferably from 0.1 to 0.5% by weight based on the total solid content of the image-forming layer.

(Printing-out Agent and Coloring Agent)

The image-forming layer according to the invention can contain a printing-out agent for obtaining a visible image immediately after heating upon exposure, or a dye or pigment serving as an image-coloring agent.

A representative example of the printing-out agent includes a combination of a compound capable of releasing an acid under the heating upon exposure (photo-acid releasing agent) and an organic dye capable of forming a salt. Specific examples thereof include a combination of o-naphthoquinonediazido-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole compound and a triazol compound, and both compounds have excellent storage stability and provide a clear print-out image.

Examples of the image-coloring agent, which can be used, include the above-described salt-forming organic dyes and other dyes. Preferred dyes include oil-soluble dyes and basic dyes, as well as the salt-forming organic dyes. Specific examples thereof include Oil Yellow #101, Oil Yellow #103, Oil Ping #312, Oil Green BG, Oil Blue BOS, Oil Blue #603, Oil Black BY, Oil Black BS, Oil Black T-505 (manufactured by Orient Chemical Industry Co., Ltd.), Victoria Pure Blue, Crystal Violet lactone, Crystal Violet (CI42555), Methyl Violet (CI42535), Ethyl Violet, Rhodamine B (CI45170B), Malachite Green (CI42000) and Methylene Blue (CI52015). Dyes described in JP-A-62-293247 are particularly preferred. The amount of the dye added is from 0.01 to 10% by weight, preferably from 0.1 to 3% by weight, based on the total solid content of the image-forming layer.

(Plasticizer)

Further, to the image-forming layer according to the invention, a plasticizer is added, if desired, in order to impart flexibility or the like to the coating film. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers or polymers of acrylic acid or methacrylic acid.

(Wax Agent)

To the image-forming layer according to the invention, a compound capable of decreasing a static friction coefficient of the surface may be added, for the purpose of imparting resistivity to scratch. Specific examples thereof include compounds containing a long chain alkyl carboxylic ester described in U.S. Pat. No. 6,117,913, JP-A-2003-149799 and Japanese Patent Application Nos. 2002-32904 and 2002-165584.

The amount of the compound added is preferably from 0.1 to 10% by weight, and more preferably from 0.5 to 5% by weight based on the total solid content of the image-forming layer.

[Preparation of Heat-sensitive Lithographic Printing Plate Precursor]

The upper image-forming layer and lower image-forming layer of the heat-sensitive lithographic printing plate precursor according to the invention can be ordinarily prepared by dissolving the components described above in a solvent and coating the resulting solution on an appropriate support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, however, the solvent should not be construed as being limited thereto. The solvents may be used individually or as a mixture thereof.

As the solvent used for coating, it is essentially preferred to select a solvent whose solubility of an alkali-soluble polymer used in the upper image-forming layer is different from that of an alkali-soluble polymer used in the lower image-forming layer. However, in order to provide a new function, it is possible to positively form a partial solution.

A method for forming isolated two layers includes, for example, a method of utilizing a difference of solvent solubility between an alkali-soluble resin used in the lower image-forming layer and an alkali-soluble resin used in the upper image-forming layer, and a method wherein after coating the upper image-forming layer, the solvent is rapidly dried and removed. These methods are described in detail below, but the method for forming isolated two layers should not be construed as being limited thereto.

The method of utilizing a difference of solvent solubility between an alkali-soluble resin used in the lower image-forming layer and an aqueous alkali solution-soluble resin used in the upper image-forming layer uses a solvent system in which any of alkali-soluble resins included in the lower image-forming layer are insoluble at the coating of the upper image-forming layer containing the aqueous alkali solution-soluble resin. Thus, when two layers are coated, each layer can be coated in a clearly separated form. For example, the formation of two layers can be conducted by selecting an alkali-soluble resin constituting the lower image-forming layer that is insoluble in a solvent capable of dissolving the aqueous alkali solution-soluble resin used in the upper image-forming layer, for example, methyl ethyl ketone or 1-methoxy-2-propanol, coating the lower image-forming layer mainly containing the alkali-soluble resin using a solvent system capable of dissolving the alkali-soluble resin constituting the lower image-forming layer, followed by drying, and then coating the upper image-forming layer mainly containing the aqueous alkali solution-soluble resin using a solvent that does not dissolve the component for the lower image-forming layer, for example, methyl ethyl ketone or 1-methoxy-2-propanol.

On the other hand, the method of rapidly drying a solvent after coating the upper image-forming layer can be carried out by a means of spraying high-pressure air from a slit nozzle installed approximately perpendicular to the transportation direction of a strip-shaped support, a means of feeding heat energy as conductive heat from the lower surface of a strip-shaped support by a roll (heating roll) supplied inside with a heating medium, for example, vapor, or a combination of these means.

A method of forming a partial solution between two layers in a level sufficiently exerting the effects of the invention can be conducted by controlling the extent in the method of utilizing a difference of solvent solubility or the method of rapidly drying a solvent after coating the upper image-forming layer described above.

The concentration of the above-described components (total solid content including additives) in the coating solution is preferably from 1 to 50% by weight. For the coating, various methods may be used and examples thereof include bar coater coating, spin coating, spray coating, curtain coating, dip coating, air knife coating, blade coating and roll coating.

For the purpose of preventing damage to the lower image-forming layer at the coating of the upper image-forming layer, it is desired that the coating of the upper image-forming layer be carried out by a method of non-contact type. It is also possible to use a bar coater coating, which is conventionally employed for coating of solvent-type, although it is a coating method of contact type. In such a case, it is desired to conduct the coating by driving in the direction of rotation in order to prevent damage to the lower image-forming layer.

The coating amount after drying of the lower image-forming layer of the heat-sensitive lithographic printing plate precursor is preferably in a range of from 0.5 to 4.0 $g/m^2$, and more preferably in a range of from 0.6 to 2.5 $g/m^2$. In such a range, the favorable printing durability, image reproducibility and sensitivity are obtained.

The coating amount after drying of the upper image-forming layer is preferably in a range of from 0.05 to 1.0 $g/m^2$, and more preferably in a range of from 0.08 to 0.7 $g/m^2$. In such a range, the favorable development latitude, scratch resistance and sensitivity are obtained.

The total coating amount of the upper and lower image-forming layers is preferably in a range of from 0.6 to 4.0 $g/m^2$, and more preferably in a range of from 0.7 to 2.5 $g/m^2$. In such a range, the favorable printing durability, image reproducibility and sensitivity are obtained.

[Support]

The support for use in the heat-sensitive lithographic printing plate precursor of the invention includes a dimensionally stable plate material having necessary strength and durability. Examples of the support include paper, paper laminated with plastic (for example, polyethylene, polypropylene or polystyrene), a metal plate (for example, an aluminum, zinc or copper plate), a plastic film (for example, a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film having laminated or deposited thereon the metal described above.

The support for use in the invention is preferably a polyester film or an aluminum plate. Among them, the aluminum plate is particularly preferred, since it is dimensionally stable and relatively inexpensive. The aluminum plate is preferably a pure aluminum plate or an alloy plate mainly comprising aluminum and containing a trace amount of foreign element. A plastic film having laminated or deposited thereon aluminum may also be used. Examples of the foreign element contained in the aluminum alloy include silicon, iron, manganese, copper, magnesium, chromium, zinc, bismuth, nickel and titanium. The content of foreign element in the alloy is at most 10% by weight.

In the invention, particularly preferred aluminum is pure aluminum but since perfectly pure aluminum is difficult to produce in view of the refining technique, the aluminum may contain a trace amount of foreign element.

The aluminum plate for use in the invention is not particularly limited on the composition and an aluminum plate conventionally known and commonly used can be appropriately used. The thickness of the aluminum plate for use in the invention is approximately from 0.1 to 0.6 mm, preferably from 0.15 to 0.4 mm, and particularly preferably from 0.2 to 0.3 mm.

Prior to surface roughening of an aluminum plate, a degreasing treatment using, for example, a surfactant, an organic solvent or an aqueous alkaline solution is performed, if desired, in order to remove the rolling oil on the surface. The surface roughening treatment of the aluminum plate is performed by various methods, for example, a method of mechanically roughening the surface, a method of electrochemically dissolving and roughening the surface or a method of chemically dissolving selectively the surface. In the mechanical roughening method, a known method, for example, ball graining, brush graining, blast graining or buff graining may be used. The electrochemical surface roughening method includes a method of performing the treatment by applying an alternating current or direct current through an electrolytic solution containing hydrochloric acid or nitric acid. A method using these two treatments in combination described in JP-A-54-63902 may also be used. After such surface roughening, the aluminum plate is, if desired, subjected to an alkali etching treatment and a neutralization treatment and then, if desired, to an anodization treatment in order to enhance the water retentivity or abrasion resistance on the surface. The electrolyte, which can be used in the anodization treatment of the aluminum plate, includes various electrolytes capable of forming a porous oxide film, and sulfuric acid, phosphoric acid, oxalic acid, chromic acid or a mixed acid thereof is ordinarily used. The concentration of the electrolyte is appropriately determined depending on the kind of electrolyte.

The conditions of anodization treatment vary depending on the electrolyte used and therefore, cannot be indiscriminately specified, however, suitable conditions are ordinarily such that the concentration of electrolyte is from 1 to 80% by weight, the solution temperature is from 5 to 70° C., the current density is from 5 to 60 A/dm$^2$, the voltage is from 1 to 100 V, and the electrolysis time is from 10 seconds to 5 minutes. When the amount of anodic oxide film is less than 1.0 g/m$^2$, insufficient printing durability may result or the non-image area of lithographic printing plate is readily scratched to cause so-called "scratch stain", namely, adhesion of ink to the scratched part at the printing. After the anodization treatment, the aluminum surface is, if desired, subjected to a hydrophilization treatment. Examples of the hydrophilization treatment for use in the invention include a method of using an alkali metal silicate (for example, an aqueous sodium silicate solution) described in U.S. Pat. Nos. 2,714,066, 3,181,461, 3,280,734 and 3,902,734. According to the method, the support is immersed or electrolyzed in an aqueous sodium silicate solution. Further, a method of treating the support with potassium fluorozirconate described in JP-B-36-22063 or with polyvinylphosphonic acid described in U.S. Pat. Nos. 3,276,868, 4,153,461 and 4,689,272 may be used.

[Undercoat Layer]

The heat-sensitive lithographic printing plate precursor of the invention comprises at least the upper image-forming layer and the lower image-forming layer on the support but, if desired, an undercoat layer may be provided between the lower image-forming layer and the support.

For components of the undercoat layer, various organic compounds are used and examples thereof include carboxymethyl cellulose; dextrin; gum arabic; phosphonic acids having an amino group, e.g., 2-aminoethylphosphonic acid; organic phosphonic acids, e.g., phenylphosphonic acid, naphthylphosphonic acid, alkyl phosphonic acid, glycerophosphonic acid, methylenediphosphonic acid and ethylenediphosphonic acid, each of which may have a substituent; organic phosphoric acids, e.g., phenylphosphoric acid, naphthylphosphoric acid, alkylphosphoric acid and glycerophosphoric acid, each of which may have a substituent; organic phosphinic acids, e.g., phenylphosphinic acid, naphthylphosphinic acid, alkylphosphinic acid and glycerophosphinic acid, each of which may have a substituent; amino acids, e.g., glycine and β-alanine; and hydrochlorides of amines having a hydroxy group, e.g., hydrochloride of triethanolamine. The compounds may be used as a mixture of two or more thereof.

It is also preferred to incorporate a compound having an onium group into the undercoat layer. The compounds having an onium group are described in greater detail, for example, in JP-A-2000-10292, JP-A-2000-108538 and JP-A-2000-241962.

Among them, a compound selected from polymer compounds including a structural unit typified by p-vinylbenzoic acid in the molecule thereof is preferably exemplified. Specific examples thereof include a copolymer of p-vinylbenzoic acid and vinylbenzyltriethylammonium salt and a copolymer of p-vinylbenzoic acid and vinylbenzyltrimethylammonium chloride.

The organic undercoat layer can be provided by the following methods. Specifically, there are a method of dissolving the above-described organic compound in water, an organic solvent, e.g., methanol, ethanol or methyl ethyl ketone, or a mixed solvent thereof, coating the resulting solution on an aluminum plate and drying it to provide the organic undercoat layer, and a method of dissolving the organic compound in water, an organic solvent, e.g., methanol, ethanol or methyl ethyl ketone, or a mixed solvent thereof, immersing an aluminum plate in the resulting solution to adsorb the compound, washing the aluminum plate with water or the like, and drying it to provide the organic undercoat layer. In the former method, the solution containing the organic compound in a concentration of 0.005 to 10% by weight can be coated by various methods. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 second to 20 minutes, preferably from 2 seconds to 1 minute. The solution used may also be adjusted its pH to a range of from 1 to 12 with a basic substance, for example, ammonia, triethylamine or potassium hydroxide or an acidic substance, for example, hydrochloric acid or phosphoric acid. Moreover, a yellow dye may be added to the solution in order to improve the tone reproducibility of the heat-sensitive lithographic printing plate precursor.

The coverage of the organic undercoat layer is suitably from 2 to 200 mg/m$^2$, and preferably from 5 to 100 mg/m$^2$. By controlling the coverage of the organic undercoat layer in such a range, favorable printing durability can be obtained.

[Plate-making and Printing]

The heat-sensitive lithographic printing plate precursor is subjected to imagewise exposure and then development processing.

Examples of the light source of emitting active light for use in the imagewise exposure include a mercury lamp, a metal halide lamp, a xenon lamp, a chemical lamp and a carbon arc lamp. Examples of the radiation include electron beam, X ray, ion beam and far infrared ray. Also, g line, i line, deep-UV light or high-density energy beam (laser beam) may be used. Examples of the laser beam include helium-neon laser, argon laser, krypton laser, helium-cadmium laser and KrF excimer laser.

In the invention, a light source having an emission wavelength in the region of from near infrared to infrared is preferred, and a solid laser or a semiconductor layer is particularly preferred.

A developing solution and replenisher therefor used in the development of the heat-sensitive lithographic printing plate precursor of the invention is a conventionally known alkali developing solution mainly comprising an organic compound having a buffering action and a base and containing substantially no silicon dioxide. Such a developing solution is hereinafter referred to as a "non-silicate developing solution". The term "containing substantially no silicon dioxide" as used herein means that a slight amount of silicon dioxide as unavoidable impurity or by-product is allowed to be present.

By using the non-silicate developing solution in the step of developing the heat-sensitive lithographic printing plate precursor of the invention, the effect of preventing generation of scratches is achieved and a favorable lithographic printing plate having no defect in the image area can be obtained. Particularly, the alkali developing solution preferably has a pH of 12.5 to 13.5.

The "non-silicate developing solution" for use in the development of the heat-sensitive lithographic printing plate precursor of the invention mainly comprises an organic compound having a buffering action and a base, as described above. Examples of the organic compound having a buffering action include compounds having a buffering action described in JP-A-8-220775, for example, sugars (particularly those represented by formulae (I) and (II)), oximes (particularly those represented by formula (III)), phenols (particularly those represented by formula (IV)) and fluorinated alcohols (particularly those represented by formula (V)). Among the compounds represented by formulae (I) to (V), those preferred are the sugars represented by formulae (I) and (II) and phenols represented by formula (IV), and those more preferred are non-reducing sugar, e.g., saccharose of the sugars represented by formulae (I) and (II) and sulfosalicylic acid. The non-reducing sugar includes trehalose-type oligosaccharides where reducing groups are bonded to each other, glycosides where a reducing group of the sugar is bonded to a non-sugar, and sugar alcohols obtained by reducing a sugar with hydrogenation. Any of these compounds are preferably used in the invention.

Examples of the trehalose-type oligosaccharide include saccharose and trehalose. Examples of the glycosides include alkyl glycoside, phenol glycoside and mustard oil glycoside.

Examples of the sugar-alcohol include D,L-arabitol, ribitol, xylitol, D,L-sorbitol, D,L-mannitol, D,L-iditol, D,L-talitol, dulcitol and allodulcitol.

In addition, maltitol obtained by hydrogenation of disaccharide, and a reduction product (reduced starch syrup) obtained by hydrogenation of oligosaccharide may be preferably used.

Among the non-reducing sugars, sugar-alcohol and saccharose are preferred, and D-sorbitol, saccharose and reduced starch syrup are more preferred because they have a buffering action in an appropriate pH region.

The non-reducing sugars may be used individually or in combination of two or more thereof. The amount of the non-reducing sugar in the developing solution is preferably from 0.1 to 30% by weight, and more preferably from 1 to 20% by weight.

The base used in combination with the organic compound having a buffering action can be appropriately selected from conventionally known alkali agents.

Examples of the alkali agent include inorganic alkali agents, for example, sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate or ammonium borate, and potassium citrate, tripotassium citrate and sodium citrate.

Other examples of the alkali agent, which can be preferably used, include organic alkali agents, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agents may be used individually or in combination of two or more thereof.

Among the compounds, sodium hydroxide and potassium hydroxide are preferred. The reason for this is that the pH can be adjusted in a wide pH region by controlling the amount added thereof based on the amount of non-reducing sugar.

Furthermore, trisodium phosphate, tripotassium phosphate, sodium carbonate and potassium carbonate are also preferred because they have a buffering action by themselves.

It is known that in the case of performing the development using an automatic developing machine, by adding an aqueous solution (replenisher) having higher alkalinity than the developing solution is added to the developing solution, a large amount of lithographic printing plate precursors can be processed without exchanging the developing solution in the development tank for a long period of time. In the invention, such a replenishing system is also preferably used. In the developing solution and the replenisher, a variety of surfactants and organic solvents may be added, if desired, for the purpose of accelerating or inhibiting the development, dispersing the development scum, or enhancing the ink-receptivity of the image area of printing plate. Preferred examples of the surfactant include anionic, cationic, nonionic and amphoteric surfactants. Furthermore, the developing solution and/or replenisher may contain, if desired, a reducing agent, for example, hydroquinone, resorcinol or a sodium salt or potassium salt of an inorganic acid (e.g., sulfurous acid, hydrogen sulfurous acid), an organic carboxylic acid, a defoaming agent and a water softening agent.

The lithographic printing plate precursor developed using the above-described developing solution and replenisher is subjected to an after-treatment with washing water, a rinsing solution containing a surfactant or the like, or a desensitizing solution containing gum arabic or a starch derivative. These treatments can be used in various combinations for the after-treatment of the heat-sensitive lithographic printing plate precursor of the invention.

Furthermore, to the heat-sensitive lithographic printing plate precursor of the invention, a so-called disposable processing system can also be applied, wherein development processing is carried out by supplying a substantially fresh developing solution per sheet of the exposed heat-sensitive lithographic printing plate precursor, besides the processing by an automatic developing machine with a replenishing system as described above.

In the case where a lithographic printing plate obtained from the heat-sensitive lithographic printing plate precursor of the invention through image exposure, development, water washing and/or rinsing and/or gumming has an unnecessary image area, elimination of the unnecessary image area is carried out. Such elimination is preferably performed by a method described, for example, in JP-B-2-13293, where a eliminating solution is applied to the unnecessary image area, allowed to stand for a predetermined time and thereafter, washed with water. However, a method described in JP-A-59-174842, where the unnecessary image area is irradiated with an active beam guided by an optical fiber and then subjected to development is also utilized.

The lithographic printing plate thus-obtained from the heat-sensitive lithographic printing plate precursor of the invention is, if desired, coated with a desensitizing gum and then can be used for printing. However, when a lithographic printing plate having higher printing durability is desired, the printing plate is subjected to a burning treatment. In the case of burning the lithographic printing plate, the plate before the burning is preferably treated with a plate burning conditioner described, for example, in JP-B-61-2518, JP-B-55-28062, JP-A-62-31859 and JP-A-61-159655.

The treatment may be performed by a method of applying the plate burning conditioner on the lithographic printing plate using a sponge or an absorbent cotton impregnated with the plate burning conditioner, a method of applying the plate burning conditioner by immersing the lithographic printing plate in a vat filled with the plate burning conditioner, or a method of applying the plate burning conditioner using an automatic coater. When the amount of plate burning conditioner applied is made uniform by a squeegee or a squeegee roller after the application, more preferred results can be obtained.

The amount of the plate burning conditioner applied is ordinarily from 0.03 to 0.8 g/m$^2$ (dry weight). The lithographic printing plate applied with the plate burning conditioner is dried, if desired, and then heated at a high temperature by a burning processor (for example, a burning processor "BP-1300" commercially available from Fuji Photo Film Co., Ltd.). The heating temperature and the heating time are preferably from 180 to 300° C. and from 1 to 20 minutes, respectively, though these may be varied depending on the components constituting the image.

The lithographic printing plate after the burning treatment can be subjected, if desired, to conventional treatment, for example, water washing and gumming, however, in the case where a plate burning conditioner containing a water-soluble polymer compound or the like is used, a so-called desensitizing treatment, for example, gumming can be omitted.

The lithographic printing plate obtained through such treatments is mounted on an offset printing machine and used for printing of a large number of sheets.

The invention is described in greater detail with reference to the following examples, but the invention should not be construed as being limited thereto.

[Preparation Examples of Support]

(Preparation of Support A)

An aluminum plate having a thickness of 0.24 mm (made of aluminum alloy containing 0.06% by weight of Si, 0.30% by weight of Fe, 0.014% by weight of Cu, 0.001% by weight of Mn, 0.001% by weight of Mg, 0.001% by weight of Zn, 0.03% by weight of Ti, and the balance of Al and unavoidable impurities) was continuously subjected to the surface treatments described below.

The aluminum plate was continuously subjected to an electrochemical graining treatment using an alternating current of 60 Hz. The electrolyte used was an aqueous solution of 10 g/liter of nitric acid (containing 5 g/liter of aluminum ion and 0.007% by weight of ammonium ion) and the temperature was 80° C. After washing with water, the aluminum plate was subjected to an etching treatment by spraying a solution having a sodium hydroxide concentration of 26% by weight and an aluminum ion concentration of 6.5% by weight at 32° C. to dissolve 0.20 g/m$^2$ of the aluminum plate, followed by washing with water by spraying. Then, the aluminum plate was subjected to a desmut treatment by spraying an aqueous solution having a sulfuric acid concentration of 25% by weight (containing 0.5% by weight of aluminum ion) and a temperature of 60° C., followed by washing with water by spraying.

The aluminum plate subjected to the surface graining treatment was then subjected to an anodizing treatment using an anodizing apparatus of a two-stage feeding electrolytic treatment method. As an electrolyte supplied to the electrolytic parts, sulfuric acid was used. Thereafter, washing with water was performed by spraying. The final amount of the oxidized film formed was 2.7 g/m$^2$.

The aluminum plate subjected to the anodizing treatment was immersed in an aqueous solution of 1% by weight 3# sodium silicate having a temperature of 30° C. for 10 seconds, whereby an alkali metal silicate treatment (silicate treatment) was carried out. Then, washing with water was performed by spraying.

On the aluminum plate after the silicate treatment obtained above, an undercoat solution having the composition described below was coated, followed by drying at 80° C. for 15 seconds to form a undercoat layer having a dry coating coverage of 17 mg/m$^2$, whereby Support A was prepared.

| <Composition of undercoat solution> | |
|---|---|
| Compound described below | 0.3 g |
| Methanol | 100 g |
| Water | 1 g |

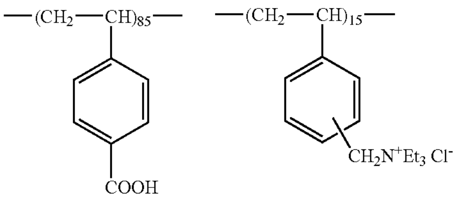

Molecular weight 28,000

Molecular weight 28,000

(Preparation of Support B)

An aluminum plate (JIS A1050) having a thickness of 0.3 mm was subjected to an etching treatment with a solution having a sodium hydroxide concentration of 30 g/liter and an aluminum ion concentration of 10 g/liter at a solution temperature of 60° C. for 10 seconds, washing with running water, neutralization and cleaning with a solution having a nitric acid concentration of 10 g/l, and washing with water. The aluminum plate was then subjected to an electrochemical graining treatment in an aqueous solution having a hydrogen chloride concentration of 15 g/l, an aluminum ion concentration of 10 g/liter and a solution temperature of 30° C. using an alternating current with a sinusoidal waveform under the condition of applied voltage Va=20V at electric charge of 500 C/dm$^2$, washing with water, an etching treatment with a solution having a sodium hydroxide concentration of 30 g/liter and an aluminum ion concentration of 10 g/liter at a solution temperature of 40° C. for 10 seconds, and washing with running water. The aluminum plate was then subjected to a desmut treatment in an aqueous sulfuric acid solution having a sulfuric acid concentration of 15% by weight and a solution temperature of 30° C., followed by washing with water. Further, the aluminum plate was subjected to an anodizing treatment using a direct current in a 10% by weight aqueous sulfuric acid solution having a solution temperature of 20° C. at a current density of 6 A/dm$^2$ so as to form an anodizing film having an amount of 2.5 g/m$^2$, followed by washing with water and drying. Thereafter, the aluminum plate was treated with an aqueous solution of 2.5% by weight sodium silicate at a temperature of 30° C. for 10 seconds, thereby preparing a support. The centerline average roughness (Ra) of the support was measured using a stylus having a diameter of 2 μm and found to be 0.48 μm.

On the aluminum plate after the silicate treatment obtained above, the undercoat solution described above was coated (at a dry coating coverage of 17 mg/m$^2$) in the same manner as in Preparation of Support A, whereby Support B was prepared.

(Preparation of Support C)

An aluminum plate (JIS A1050) having a thickness of 0.3 mm was degreased by washing with trichloroethylene and then, the surface thereof was grained using nylon brushes and an aqueous suspension of 400-mesh pumice stone, followed by washing thoroughly with water. The aluminum plate was immersed in an aqueous 25% sodium hydroxide solution of 45° C. for 9 seconds to conduct etching, washed with water, immersed in 20% nitric acid for 20 seconds and then washed with water. The etched amount of the grained surface was about 3 g/m$^2$. Thereafter, the aluminum plate was anodized in 7% sulfuric acid as the electrolyte by applying a direct current at a current density of 15 A/dm$^2$ to provide an anodic oxide film in an amount of 3 g/m$^2$. The aluminum plate was then washed with water, dried and further treated with an aqueous 2.5% by weight sodium silicate solution of 30° C. for 10 seconds. In the same manner as in Preparation of Support A, the undercoat solution was coated on the aluminum plate after the silicate treatment obtained above to prepare Support C. The coverage of the coating film after drying was 17 mg/m$^2$ (Preparation of Support D)

An aluminum plate having g a thickness of 0.24 mm (made of aluminum alloy containing 0.06% by weight of Si, 0.30% by weight of Fe, 0.014% by weight of Cu, 0.001% by weight of Mn, 0.001% by weight of Mg, 0.001% by weight of Zn, 0.03% by weight of Ti, and the balance of Al and unavoidable impurities) was continuously subjected to the surface treatments described below.

Mechanical graining of the aluminum plate was carried out using rotating roller-form nylon brushes while supplying a suspension of abrasives (silica sand) in water having a specific gravity of 1.12 to the surface of the aluminum plate as an abrasive slurry. The aluminum plate was then subjected to an etching treatment by splaying a solution having a sodium hydroxide concentration of 2.6% by weight, an aluminum ion concentration of 6.5% by weight and a temperature of 70° C. to dissolve 6 g/m$^2$ of the aluminum plate, followed by washing with water by spraying. Further, the aluminum plate was subjected to a desmut treatment by spraying an aqueous solution having a nitric acid concentration of 1% by weight (containing 0.5% by weight of aluminum ion) and a temperature of 30° C., followed by washing with water by spraying. Then, using an alternating current of 60 Hz, an electrochemical graining treatment was continuously carried out. The electrolyte used was an aqueous solution of 10 g/liter of nitric acid (containing 5 g/liter of aluminum ion and 0.007% by weight of ammonium ion) and the temperature was 80° C. After washing with water, the aluminum plate was subjected to an etching treatment by spraying a solution having a sodium hydroxide concentration of 26% by weight and an aluminum ion concentration of 6.5% by weight at 32° C. to dissolve 0.20 g/m$^2$ of the aluminum plate, followed by washing with water by spraying. Then, the aluminum plate was subjected to a desmut treatment by spraying an aqueous solution having a sulfuric acid concentration of 25% by weight (containing 0.5% by weight of aluminum ion) and a temperature of 60° C., followed by washing with water by spraying.

The aluminum plate was then subjected to an anodizing treatment using an anodizing apparatus of a two-stage feeding electrolytic treatment method. As an electrolyte supplied to the electrolytic parts, sulfuric acid was used. Thereafter, washing with water was performed by spraying. The final amount of the oxidized film formed was 2.7 g/m$^2$.

The aluminum plate subjected to the anodizing treatment was immersed in an aqueous solution of 1% by weight 3# sodium silicate and a temperature of 30° C. for 10 seconds, whereby an alkali metal silicate treatment (silicate treatment) was carried out. Then, washing with water was performed by spraying.

On the aluminum plate after the silicate treatment obtained above, the undercoat solution having the composition described above was coated, followed by drying at 80° C. for 15 seconds to form a undercoat layer having a dry coating coverage of 15 mg/m$^2$, whereby Support D was prepared.

(Preparation of Support E)

An aluminum plate same as used in Preparation of Support D was continuously subjected to the surface treatments described below.

The aluminum plate was continuously subjected to an electrochemical graining treatment using an alternating current of 60 Hz. The electrolyte used was an aqueous solution of 10 g/liter of nitric acid (containing 5 g/liter of aluminum ion and 0.007% by weight of ammonium ion) and the temperature was 80° C. After washing with water, the aluminum plate was subjected to an etching treatment by spraying a solution having a sodium hydroxide concentration of 26% by weight and an aluminum ion concentration of 6.5% by weight at 32° C. to dissolve 0.20 g/m$^2$ of the aluminum plate, followed by washing with water by spraying. Then, the aluminum plate was subjected to a desmut treatment by spraying an aqueous solution having a sulfuric acid concentration of 25% by weight (containing 0.5% by weight of aluminum ion) and a temperature of 60° C., followed by washing with water by spraying.

On the aluminum plate subjected to the electrochemical graining treatment were conducted the anodizing treatment, silicate treatment and coating of undercoat solution in the same manner as in Preparation of Support D, whereby Support E was prepared.

(Preparation of Support F)

Each of the steps (a) to (l) was performed in this order to prepare Support F.

(a) Mechanical Graining Treatment

An aluminum plate of JIS A1050 having a thickness of 0.3 mm was subjected to mechanical graining using rotating roller-form nylon brushes while supplying a suspension of abrasives (silica sand) in water having a specific gravity of 1.12 to the surface of the aluminum plate as an abrasive slurry. The mean grain size of the abrasives was 8 μm and the maximum grain size thereof was 50 μm. The material of bristle of the nylon brush was Nylon 6, 10, the length of the bristle was 50 mm, and the diameter of the bristle was 0.3 mm. The nylon brush was prepared by making many holes in the wall of a stainless steel-made cylinder having a diameter of 300 mm and bristles were planted in the holes closely. Three rotary brushes were used. The distance of two supporting rollers (diameter of 200 mm) under the brushes was 300 mm. The brushes pressed the aluminum plate by the brush rollers until the load of a driving motor rotating the brushes became 7 kW plus to the load before pressing the aluminum plate by the brush rollers. The rotating direction of the brushes was same as the moving direction of the aluminum plate. The rotation number of the brushes was 200 rpm.

(b) Alkali Etching Treatment

The aluminum plate treated as described above was subjected to an etching treatment by splaying an aqueous sodium hydroxide solution (sodium hydroxide concentration: 26% by weight; aluminum ion concentration: 6.5% by weight) having a temperature of 70° C. to dissolve 6 $g/m^2$ of the aluminum plate. Thereafter, water washing was carried out by spraying well water.

(c) Desmut Treatment

The desmut treatment was carried out by spraying an aqueous solution having a nitric acid concentration of 1% by weight (containing 0.5% by weight of aluminum ion) having a temperature of 30° C., and thereafter the aluminum plate was washed by spraying water. As the aqueous nitric acid solution used in the desmut treatment, waste liquid from the step of carrying out electrochemical graining using alternating current in an aqueous nitric acid solution was employed.

(d) Electrochemical Graining Treatment

Using an alternating current of 60 Hz, an electrochemical graining treatment was continuously carried out. The electrolyte used was an aqueous solution of 10.5 g/liter of nitric acid (containing 5 g/liter of aluminum ion) and the temperature was 50° C. The electrochemical graining treatment was conducted using an alternating current source which provides a trapezoidal rectangular wave alternating current of 0.8 msec in time TP for the current to reach its peak from zero and 1:1 in duty ratio and using a carbon electrode as a counter electrode. A ferrite was used as an auxiliary anode. As an electrolysis vessel, a radial cell type was used.

The current density was 30 $A/dm^2$ in the peak value of the electric current and the quantity of electricity was 220 $C/dm^2$ in terms of the total quantity of electricity during the aluminum plate functioning as an anode. To the auxiliary electrode, 5% of the electric current from the electric source was provided.

Thereafter, water washing was carried out by spraying well water.

(e) Alkali Etching Treatment

The aluminum plate was subjected to an etching treatment by spraying an aqueous solution having a sodium hydroxide concentration of 26% by weight and an aluminum ion concentration of 6.5% by weight at 32° C. to dissolve 0.20 $g/m^2$ of the aluminum plate, whereby the smut components mainly composed of aluminum hydroxide formed in the electrochemical graining using an alternating current in the preceding step were removed and also, the edge portions of pits formed were dissolved to make the edge portions smooth. Thereafter, water washing was carried out by spraying well water.

(f) Desmut Treatment

The desmut treatment was carried out by spraying an aqueous solution having a sulfuric acid concentration of 15% by weight (containing 4.5% by weight of aluminum ion) having a temperature of 30° C., and thereafter, water washing was carried out by spraying well water. As the aqueous nitric acid solution used in the desmut treatment, waste liquid from the step of carrying out electrochemical graining using alternating current in an aqueous nitric acid solution was employed.

(g) Electrochemical Graining Treatment

Using an alternating current of 60 Hz, an electrochemical graining treatment was continuously carried out. The electrolyte used was an aqueous solution of 7.5 g/liter of hydrochloric acid (containing 5 g/liter of aluminum ion) and the temperature was 35° C. The electrochemical graining treatment was conducted using an alternating current source which provides a rectangular wave alternating current and using a carbon electrode as a counter electrode. A ferrite was used as an auxiliary anode. As an electrolysis vessel, a radial cell type was used.

The current density was 25 $A/dm^2$ in the peak value of the electric current and the quantity of electricity was 50 $C/dm^2$ in terms of the total quantity of electricity during the aluminum plate functioning as an anode.

Thereafter, water washing was carried out by spraying well water.

(h) Alkali Etching Treatment

The aluminum plate was subjected to an etching treatment by spraying an aqueous solution having a sodium hydroxide concentration of 26% by weight and an aluminum ion concentration of 6.5% by weight at 32° C. to dissolve 0.10 $g/m^2$ of the aluminum plate, whereby the smut components mainly composed of aluminum hydroxide formed in the electrochemical graining using alternating current in the preceding step were removed and also, the edge portions of pits formed were dissolved to make the edge portions smooth. Thereafter, water washing was carried out by spraying well water.

(i) Desmut Treatment

The desmut treatment was carried out by spraying an aqueous solution having a sulfuric acid concentration of 25% by weight (containing 0.5% by weight of aluminum ion) having a temperature of 60° C., and thereafter, water washing was carried out by spraying well water.

(j) Anodizing Treatment

The anodizing treatment was carried out using sulfuric acid as an electrolyte. The electrolyte had a sulfuric acid concentration of 170 g/liter (containing 0.5% by weight of aluminum ion) and the temperature was 43° C. Thereafter, water washing was carried out by spraying well water.

The current density was about 30 $A/dm^2$. The final amount of the oxidized film formed was 2.7 $g/m^2$.

(k) Silicate Treatment

The silicate treatment was conducted in the same manner as in Preparation of Support D. The amount of silicate attached was 3.5 $mg/m^2$.

(1) Formation of Undercoat Layer

The coating of the undercoat solution described above was conducted in the same manner as in Preparation of Support D. A coating coverage of the undercoat layer after drying was 15 $mg/m^2$.

EXAMPLE 1

On Support A obtained above, Coating solution 1 for lower layer having the composition shown below was coated by a bar coater so as to have a coated amount of 0.85 g/$m^2$, dried at 160° C. for 44 seconds and immediately thereafter cooled with cool air of from 17 to 20° C. until temperature of the support became 35° C. Then, Coating solution 1 for upper layer having the composition shown below was coated by a bar coater so as to have a coated amount of 0.22 g/$m^2$, dried at 148° C. for 25 seconds and thereafter gradually cooled with air of from 20 to 26° C., whereby Heat-sensitive lithographic printing plate precursor 1 was prepared.

(Coating Solution 1 for Lower Layer)

| | |
|---|---|
| N-(4-Aminosulfonylphenyl)methacrylamide/acrylonitrile/methyl methacrylate copolymer (36/34/30% by weight; weight average molecular weight: 50,000; acid value: 2.65) | 2.0 g |
| Cyanine dye A (having the structure shown below) | 0.15 g |
| 4,4'-Bishydroxyphenylsulfone | 0.1 g |
| Tetrahydrophthalic anhydride | 0.2 g |
| p-Toluenesulfonic acid | 0.01 g |
| 3-Methoxy-4-diazodiphenylamine hexafluorophosphate | 0.03 g |
| Compound obtained by replacing counter ion of Ethyl Violet with 6-hydroxy-2-naphthalenesulfonate | 0.1 g |
| Megafac F-780F (solid content: 30%) (manufactured by DAINIPPON INK & CHEMICALS, INC.) (Fluorine-containing surfactant for improving coated surface state) | 0.02 g |
| Methyl ethyl ketone | 25 g |
| 1-Methoxy-2-propanol | 13 g |
| γ-Butyrolactone | 13 g |

Cyanine Dye A

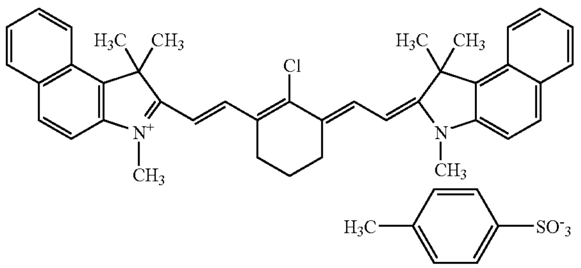

(Coating Solution 1 for Upper Layer)

| | |
|---|---|
| m,p-Cresol novolak resin (m/p ratio = 6/4; weight average molecular weight: 4,500; containing 0.8% by weight of unreacted cresol) | (amount as described in Table 1) |
| Cyanine dye A (having the structure shown above) | 0.05 g |
| Ethyl methacrylate/isobutyl methacrylate/acrylic acid copolymer | 0.1 g |
| Ammonium compound represented by Formula (B) shown below | 0.1 g |
| Megafac F-780F (solid content: 30%) (manufactured by DAINIPPON INK & CHEMICALS, INC.) | 0.03 g |

-continued

| | |
|---|---|
| Megafac F-781F (manufactured by DAINIPPON INK & CHEMICALS, INC.) | 0.07 g |
| Methyl ethyl ketone | 20 g |
| 1-Methoxy-2-propanol | 40 g |

Formula (B)

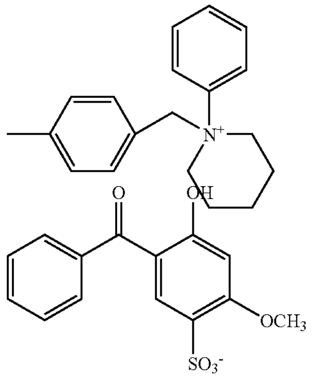

EXAMPLE 2

Heat-sensitive lithographic printing plate precursor 2 was prepared in the same manner as in Example 1 except for changing Support A used in Example 1 to Support B described above.

EXAMPLE 3

Heat-sensitive lithographic printing plate precursor 3 was prepared in the same manner as in Example 1 except for changing Support A used in Example 1 to Support C described above.

EXAMPLES 4 TO 31

Heat-sensitive lithographic printing plate precursors 4 to 31 were prepared in the same manner as in Example 1 except for changing the ethyl methacrylate/isobutyl methacrylate/acrylic acid copolymer contained in Coating solution 1 for upper layer used in Example 1 to the compounds shown in Table 1 below, respectively.

COMPARATIVE EXAMPLE 1

Heat-sensitive lithographic printing plate precursor for Comparative Example 1 was prepared in the same manner as in Example 1 except for changing Coating solution 1 for upper layer used in Example 1 to Coating solution 2 for upper layer having the composition shown below.

(Coating Solution 2 for Upper Layer)

| | |
|---|---|
| m,p-Cresol novolak resin (m/p ratio = 6/4; weight average molecular weight: 4,500; containing 0.8% by weight of unreacted cresol) | 1.0 g |

-continued

| | |
|---|---|
| Cyanine dye A (having the structure shown above) | 0.05 g |
| Ammonium compound represented by Formula (B) shown above | 0.1 g |
| Megafac F-780F (solid content: 30%) (manufactured by DAINIPPON INK & CHEMICALS, INC.) | 0.03 g |
| Megafac F-781F (manufactured by DAINIPPON INK & CHEMICALS, INC.) | 0.07 g |
| Methyl ethyl ketone | 20 g |
| 1-Methoxy-2-propanol | 40 g |

COMPARATIVE EXAMPLE 2

Heat-sensitive lithographic printing plate precursor for Comparative Example 2 was prepared in the same manner as in Example 1 except for changing the ethyl methacrylate/isobutyl methacrylate/acrylic acid copolymer contained in Coating solution 1 for upper layer used in Example 1 to the compound shown in Table 1 below.

(Evaluation of Heat-sensitive Lithographic Printing Plate Precursor)

<Evaluation of Sensitivity>

Sensitivity was determined in the following manner with each of Heat-sensitive lithographic printing plate precursors 1 to 31 and the heat-sensitive lithographic printing plate precursors for Comparative Examples 1 and 2 described above.

A solid image was drawn on the lithographic printing plate precursor at a beam intensity raging from 2 to 10 W and a drum rotation speed of 150 rpm using Trendsetter manufactured by Creo Inc. The exposed lithographic printing plate precursor was developed using PS Processor LP940H manufactured by Fuji Photo film Co., Ltd., to which a developing solution prepared by diluting a non-silicate type developer DT-2 manufactured by Fuji Photo film Co., Ltd. in a ratio of 1:8 and a solution prepared by diluting Finisher FG-1 manufactured by Fuji Photo film Co., Ltd. in a ratio of 1:1 had been charged, at a solution temperature of 30° C. for a developing time of 12 seconds. The electric conductivity of the developing solution was 43 mS/cm.

The printing plates after development were observed by a loupe of 25 magnifications to evaluate the presence of residual film on the printing plates, and the printing plate on which the residual film present was in a level of causing substantially no printing stain was determined. From the beam intensity used for the exposure to form the printing plate, a practical exposure energy was calculated to evaluate the sensitivity. The results obtained are shown in Table 1 below. The smaller the exposure energy, the higher the sensitivity is.

<Evaluation of Scratch Resistant>

Each of Heat-sensitive lithographic printing plate precursors 1 to 31 and the heat-sensitive lithographic printing plate precursors for Comparative Examples 1 and 2 were scratched using a scratching test machine manufactured by HEIDON Co. with applying a load to a sapphire tip (tip diameter: 1.0 mm). Immediately thereafter, the exposed lithographic printing plate precursor was developed under the same conditions as described in the evaluation of sensitivity.

The printing plates after development were observed and a numeral value of the load applied, the scratch formed by which was not visually recognized, was determined to evaluate the scratch resistance. The results obtained are shown in Table 1 below. The larger the numerical value, the better the scratch resistance is.

<Evaluation of Development Latitude>

A test pattern was imagewise drawn on each of Heat-sensitive lithographic printing plate precursors 1 to 31 and the heat-sensitive lithographic printing plate precursors for Comparative Examples 1 and 2 at a beam intensity of 9 W and a drum rotation speed of 150 rpm using Trendsetter manufactured by Creo Inc. The exposed lithographic printing plate precursor was developed using PS Processor LP940H manufactured by Fuji Photo film Co., Ltd., to which a developing solution prepared by diluting Developer DT-2R manufactured by Fuji Photo film Co., Ltd. in a ratio of 1:5 and introducing carbon dioxide gas into the solution until electric conductivity reaching 37 mS/cm, and a solution prepared by diluting Finisher FG-1 manufactured by Fuji Photo film Co., Ltd. in a ratio of 1:1 had been charged, at a solution temperature of 30° C. for a developing time of 12 seconds. Then, to the developing solution was added an appropriate amount of DT-2R (1:5 diluted solution) to adjusted its electric conductivity to 39 mS/cm and using the resulting developing solution, the lithographic printing plate precursor imagewise drawn a test pattern in the same manner as described above was developed. The same procedures as above were repeated with increasing the electric conductivity by 2 mS/cm each time until reduction of layer thickness due to the development of image was remarkably observed.

With the plate developed with each developing solution, the presence of stain or coloration caused by the residual film in the non-image area due to development inferior was confirmed, and the electric conductivity of the developing solution at which the development could be well performed was determined. Further, a limit electric conductivity was determined at which the reduction of layer thickness due to the development was observed to an extent that the reduction of layer thickness was not substantially adversely affect printing durability of the plate.

A range between the electric conductivity of the developing solution at which the development could be well performed and the limit electric conductivity at which the reduction of layer thickness due to the development was observed to an extent that the reduction of layer thickness was not substantially adversely affect printing durability of the plate was referred to as the development latitude. The results obtained are shown in Table 1 below. It is evaluated that the larger the numerical value, the broader the development latitude is.

TABLE 1

| | | | Copolymer (A) according to Invention | | | | | | | | | | Results of Evaluation | | |
|---|---|---|---|---|---|---|---|---|---|---|---|---|---|---|---|
| | Support | Amount of Novolak | Amount | Monomer A | Mol % | Monomer B | Mol % | Monomer C | Mol % | Monomer D | Mol % | Molecular Weight | Scratch Resistance | Sensitivity | Development Latitude |
| Example 1 | A | 0.90 g | 0.10 g | A-2 | 26 | B-11 | 74 | — | 0 | — | 0 | $5.5 \times 10^5$ | 3 g | 50 mJ | 6 mS/cm |
| Example 2 | B | 0.90 g | 0.10 g | A-2 | 26 | B-11 | 74 | — | 0 | — | 0 | $5.5 \times 10^5$ | 3 g | 50 mJ | 6 mS/cm |
| Example 3 | C | 0.90 g | 0.10 g | A-2 | 26 | B-11 | 74 | — | 0 | — | 0 | $5.5 \times 10^5$ | 3 g | 55 mJ | 8 mS/cm |
| Example 4 | C | 0.90 g | 0.10 g | A-2 | 13 | B-1 | 67 | B-12 | 20 | — | 0 | $5.0 \times 10^5$ | 3 g | 60 mJ | 8 mS/cm |
| Example 5 | C | 0.90 g | 0.10 g | A-2 | 13 | B-1 | 67 | B-12 | 20 | — | 0 | $5.0 \times 10^5$ | 3 g | 60 mJ | 9 mS/cm |
| Example 6 | C | 0.95 g | 0.05 g | A-2 | 13 | B-1 | 67 | B-12 | 20 | — | 0 | $5.0 \times 10^5$ | 3 g | 60 mJ | 7 mS/cm |
| Example 7 | C | 0.90 g | 0.10 g | A-2 | 26 | B-7 | 37 | B-9 | 37 | — | 0 | $4.8 \times 10^5$ | 3 g | 58 mJ | 8 mS/cm |
| Example 8 | C | 0.95 g | 0.05 g | A-2 | 26 | B-7 | 37 | B-9 | 37 | — | 0 | $4.8 \times 10^5$ | 3 g | 58 mJ | 8 mS/cm |
| Example 9 | C | 0.90 g | 0.10 g | A-1 | 33 | B-3 | 67 | — | 0 | — | 0 | $2.9 \times 10^5$ | 3 g | 60 mJ | 5 mS/cm |
| Example 10 | C | 0.94 g | 0.06 g | A-1 | 33 | B-3 | 67 | — | 0 | — | 0 | $2.9 \times 10^5$ | 3 g | 60 mJ | 6 mS/cm |
| Example 11 | C | 0.94 g | 0.06 g | A-1 | 23 | B-6 | 77 | — | 0 | — | 0 | $3.5 \times 10^5$ | 3 g | 62 mJ | 5 mS/cm |
| Example 12 | C | 0.94 g | 0.06 g | A-1 | 28 | B-8 | 72 | — | 0 | — | 0 | $3.1 \times 10^5$ | 3 g | 62 mJ | 5 mS/cm |
| Example 13 | C | 0.94 g | 0.06 g | A-1 | 21 | B-13 | 79 | — | 0 | — | 0 | $3.3 \times 10^5$ | 3 g | 53 mJ | 6 mS/cm |
| Example 14 | C | 0.90 g | 0.10 g | A-1 | 30 | B-15 | 70 | — | 0 | — | 0 | $4.0 \times 10^5$ | 3 g | 55 mJ | 6 mS/cm |
| Example 15 | C | 0.90 g | 0.10 g | A-2 | 4 | B-14 | 30 | B-2 | 30 | B-17 | 36 | $5.0 \times 10^5$ | 3 g | 60 mJ | 4 mS/cm |
| Example 16 | C | 0.90 g | 0.10 g | A-2 | 6 | B-4 | 25 | B-2 | 50 | B-17 | 19 | $4.8 \times 10^5$ | 3 g | 60 mJ | 6 mS/cm |
| Example 17 | C | 0.90 g | 0.10 g | A-2 | 28 | B-5 | 72 | — | 0 | — | 0 | $4.0 \times 10^5$ | 3 g | 60 mJ | 5 mS/cm |
| Example 18 | C | 0.90 g | 0.10 g | A-3 | 20 | B-9 | 80 | — | 0 | — | 0 | $3.0 \times 10^5$ | 3 g | 55 mJ | 6 mS/cm |
| Example 19 | C | 0.90 g | 0.10 g | A-1 | 30 | B-10 | 70 | — | 0 | — | 0 | $4.5 \times 10^5$ | 3 g | 60 mJ | 5 mS/cm |
| Example 20 | C | 0.90 g | 0.10 g | A-2 | 25 | S-14 | 75 | — | 0 | — | 0 | $6.0 \times 10^5$ | 3 g | 55 mJ | 6 mS/cm |
| Example 21 | C | 0.90 g | 0.10 g | A-4 | 30 | B-7 | 70 | — | 0 | — | 0 | $10.0 \times 10^5$ | 3 g | 55 mJ | 7 mS/cm |
| Example 22 | C | 0.70 g | 0.30 g | A-5 | 30 | B-16 | 70 | — | 0 | — | 0 | $8.0 \times 10^5$ | 3 g | 60 mJ | 7 mS/cm |
| Example 23 | C | 0.60 g | 0.40 g | A-1 | 30 | B-10 | 70 | — | 0 | — | 0 | $4.5 \times 10^5$ | 3 g | 62 mJ | 5 mS/cm |
| Example 24 | C | 0.90 g | 0.10 g | A-1 | 30 | B-10 | 70 | — | 0 | — | 0 | $1.0 \times 10^5$ | 3 g | 50 mJ | 5 mS/cm |
| Example 25 | C | 0.90 g | 0.10 g | A-1 | 30 | B-10 | 70 | — | 0 | — | 0 | $8.0 \times 10^5$ | 3 g | 60 mJ | 5 mS/cm |
| Example 26 | C | 0.90 g | 0.10 g | A-2 | 28 | B-16 | 72 | — | 0 | — | 0 | $4.0 \times 10^5$ | 3 g | 55 mJ | 6 mS/cm |
| Example 27 | C | 0.90 g | 0.10 g | A-2 | 10 | A-3 | 5 | B-16 | 85 | — | 0 | $3.0 \times 10^5$ | 3 g | 55 mJ | 6 mS/cm |
| Example 28 | C | 0.80 g | 0.20 g | A-2 | 10 | A-3 | 5 | B-16 | 85 | — | 0 | $3.0 \times 10^5$ | 3 g | 60 mJ | 6 mS/cm |
| Example 29 | C | 0.70 g | 0.30 g | A-2 | 10 | A-3 | 5 | B-16 | 85 | — | 0 | $3.0 \times 10^5$ | 3 g | 62 mJ | 5 mS/cm |
| Example 30 | C | 0.60 g | 0.40 g | A-2 | 10 | A-3 | 5 | B-16 | 85 | — | 0 | $3.0 \times 10^5$ | 3 g | 65 mJ | 5 mS/cm |
| Example 31 | C | 0.57 g | 0.43 g | A-2 | 28 | B-16 | 72 | — | 0 | — | 0 | $3.0 \times 10^5$ | 3 g | 60 mJ | 6 mS/cm |
| Comparative Example 1 | C | 1.00 g | None | — | — | — | — | — | — | — | — | — | 1 g | 55 mJ | 2 mS/cm |
| Comparative Example 2 | C | 0.90 g | 0.10 g | C-1 | 36 | B-2 | 34 | B-14 | 30 | — | 0 | $5.3 \times 10^5$ | 3 g | 55 mJ | 2 mS/cm |

The monomers shown in Table 1 are as follows:

Monomer Forming the Monomer Unit Represented by Formula (A) (Column of Monomer A)

A-1: Acrylic acid

A-2: Methacrylic acid

A-3: Maleic acid

A-4 and A-5: Monomers having the structure represented by formula shown below.

(A-4)

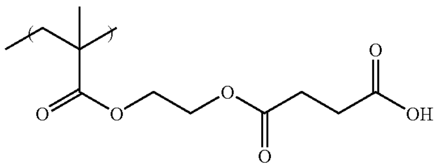

(A-5)

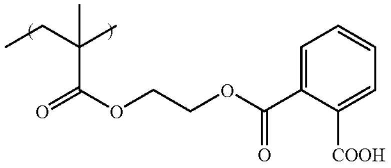

Copolymerization Monomers (Columns of Monomer B, Monomer C and Monomer D)

B-1: Allyl methacrylate
B-2: Acrylonitrile
B-3: Benzyl acrylate
B-4: Benzyl methacrylate
B-5: Cyclohexyl methacrylate
B-6: Ethyl acrylate
B-7: Ethyl methacrylate
B-8: Isobutyl acrylate
B-9: Isobutyl methacrylate
B-10: Isopropyl acrylate
B-11: Isopropyl methacrylate
B-12: Isopropylacrylamide
B-13: Methyl acrylate
B-14: Methyl methacrylate
B-15: n-Butyl acrylate
B-16: n-Butyl methacrylate
B-17: Hydroxyethyl methacrylate Monomer Used in Place of the Monomer Forming the Monomer Unit Represented by Formula (A) in Comparative Example (Column of Monomer A):

C-1: N-(4-Aminosulfonylphenyl)methacrylamide

It can be seen from the results shown in Table 1 that the development latitude is considerably enlarged and the sensitivity and scratch resistance are maintained in favorable levels with Heat-sensitive lithographic printing plate precursors 1 to 31 according to the invention in comparison with the heat-sensitive lithographic printing plate precursors for Comparative Examples 1 and 2.

EXAMPLES 32 to 68 AND COMPARATIVE EXAMPLES 3 TO 5

[Preparation of Heat-sensitive Lithographic Printing Plate Precursor]

On the support obtained as described above, Coating solution 2 for lower layer having the composition shown below was coated and dried at 130° C. for 50 seconds using PERFECT OVEN PH200 manufactured by TABAI Corp. by setting Wind Control 7 to provide a lower layer having a dry coated amount of 0.85/$m^2$. Then, Coating solution 3 for upper layer having the composition shown below was coated so as to have a dry coated amount of 0.25 g/$m^2$. The drying was conducted under condition of 140° C. for one minute.

Kinds of copolymers containing a monomer unit represented by formula (A') and amounts thereof added to the coating solutions used in Examples 32 to 68 and Comparative Examples 3 to 5 are shown in Table 2 below.

(Coating Solution 2 for Lower Layer)

| | |
|---|---|
| N-(4-Aminosulfonylphenyl)methacrylamide/acrylonitrile/methyl methacrylate copolymer (36/34/30% by weight; weight average molecular weight: 50,000; acid value: 2.65) | 2.133 g |
| Cyanine dye A (having the structure shown above) | 0.109 g |
| 4,4'-Bishydroxyphenylsulfone | 0.126 g |
| cis-$\Delta^4$-Tetrahydrophthalic anhydride | 0.190 g |
| p-Toluenesulfonic acid | 0.008 g |
| 3-Methoxy-4-diazodiphenylamine hexafluorophosphate | 0.030 g |
| Compound obtained by replacing counter ion of Ethyl Violet with 6-hydroxy-2-naphthalenesulfonate | 0.100 g |
| Megafac F176 (manufactured by DAINIPPON INK & CHEMICALS, INC.) (Fluorine-containing surfactant for improving coated surface state) | 0.035 g |
| Methyl ethyl ketone | 25.38 g |
| 1-Methoxy-2-propanol | 13.0 g |
| γ-Butyrolactone | 13.2 g |

(Coating Solution 3 for Upper Layer)

| | |
|---|---|
| m,p-Cresol novolak resin (m/p ratio = 6/4; weight average molecular weight: 4,500; containing 0.8% by weight of unreacted cresol) | 0.3478 g |
| Copolymer according to the invention (kind and amount as described in Table 2) | |
| Cyanine dye A (having the structure shown above) | 0.0192 g |
| Ammonium compound having the structure shown below | 0.0115 g |

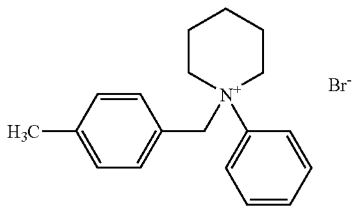

| | |
|---|---|
| Megafac F176 (20%) (manufactured by DAINIPPON INK & CHEMICALS, INC.) (Surfactant for improving coated surface state) | 0.022 g |
| 1-Methoxy-2-propanol | 13.07 g |
| Methyl ethyl ketone | 6.79 g |

In the comparative examples, methacrylic acid/methyl methacrylate copolymer was used in place of the copolymer according to the invention as shown in Table 2.

[Evaluation of Development Latitude]

A test pattern was imagewise drawn on each of the lithographic printing plate precursors at a beam intensity of 9 W and a drum rotation speed of 150 rpm using Trendsetter manufactured by Creo Inc. The exposed lithographic printing plate precursor was developed using PS Processor LP940H manufactured by Fuji Photo film Co., Ltd., to which a developing solution prepared by diluting Developer DT-2R manufactured by Fuji Photo film Co., Ltd. using 5 parts by volume of water per one part by volume of the developer (hereinafter simply referred to as "1:5 diluted solution") and introducing carbon dioxide gas into the solution until electric conductivity reaching 37 mS/cm, and a solution prepared by diluting Finisher FG-1 manufactured by Fuji Photo film Co., Ltd. using one part by volume of water per one part by volume of the finisher ("1:1 diluted solution") had been charged, at a solution temperature of 30° C. for a developing time of 12 seconds. Then, to the developing solution was added an appropriate amount of DT-2R (1:5 diluted solution) to adjusted its electric conductivity to 39 mS/cm and using the resulting developing solution, the lithographic printing plate precursor imagewise drawn a test pattern in the same manner as described above was developed. The same procedures as above were repeated with increasing the electric conductivity by 2 mS/cm each time until reduction of layer thickness due to the development of image was remarkably observed.

With the plate developed with each developing solution, the presence of stain or coloration caused by the residual film of the non-image area due to development inferior was confirmed, and the electric conductivity of the developing solution at which the development could be well performed was determined. Further, a limit electric conductivity was determined at which the reduction of layer thickness due to the development was observed to an extent that the reduction of layer thickness was not substantially adversely affect the printing durability of the plate.

A range between the electric conductivity of the developing solution at which the development could be well performed and the limit electric conductivity at which the reduction of layer thickness due to the development was observed to an extent that the reduction of layer thickness was not substantially adversely affect printing durability of the plate was referred to as the development latitude.

In addition, the similar evaluations were conducted using a developing solution having the composition shown below in place of the DT-2R (1:5 diluted solution).

(Composition of Alkali Developing Solution B)

| | |
|---|---|
| $SiO_2.K_2O$ | 3.8 parts by weight |
| ($K_2O/SiO_2$ = 1/1 in molar ratio) | |
| Citric acid | 0.5 parts by weight |
| Water | 95.7 parts by weight |

[Evaluation of Scratch Resistant]

Each of the lithographic printing plate precursors was scratched using a scratching test machine manufactured by HEIDON Co. with applying a load to a sapphire tip (tip diameter: 1.0 mm). Immediately thereafter, the exposed lithographic printing plate precursor was developed using PS Processor LP940H manufactured by Fuji Photo film Co., Ltd., to which a developing solution prepared by diluting Developer DT-2 manufactured by Fuji Photo film Co., Ltd. using 8 parts by volume of water per one part by volume of the developer ("1:8 diluted solution") and a solution prepared by diluting Finisher FG-1 manufactured by Fuji Photo film Co., Ltd. using one part by volume of water per one part by volume of the finisher ("1:1 diluted solution") had been charged, at a solution temperature of 30° C. for a developing time of 12 seconds. Electric conductivity of the developing solution was 43 mS/cm. A numeral value of the load applied, the scratch formed by which was not visually recognized, was determined to evaluate the scratch resistance. It is evaluated that the larger the numerical value, the better the scratch resistance is.

The results of the evaluations are shown in Table 2 below.

TABLE 2

| | Copolymer according to Invention | | | | | | | | | | | Development Latitude | | Scratch |
|---|---|---|---|---|---|---|---|---|---|---|---|---|---|---|
| | Support | Amount | Monomer a | Mol % | Monomer b | Mol % | Monomer c | Mol % | Monomer d | Mol % | Molecular Weight | DT-2R | Developing Solution B | Resistance |
| Example 32 | D | 0.10 g | a-1 | 18 | b-11 | 82 | — | 0 | — | 0 | $5.5 \times 10^5$ | 8 mS/cm | 10 mS/cm | 15 g |
| Example 33 | E | 0.10 g | a-1 | 22 | b-14 | 78 | — | 0 | — | 0 | $5.5 \times 10^5$ | 9 mS/cm | 8 mS/cm | 20 g |
| Example 34 | B | 0.10 g | a-1 | 24 | b-14 | 76 | — | 0 | — | 0 | $5.5 \times 10^5$ | 8 mS/cm | 12 mS/cm | 20 g |
| Example 35 | F | 0.10 g | a-3 | 30 | b-14 | 70 | — | 0 | — | 0 | $5.5 \times 10^5$ | 8 mS/cm | 14 mS/cm | 25 g |
| Example 36 | F | 0.10 g | a-5 | 15 | b-3 | 85 | — | 0 | — | 0 | $5.0 \times 10^5$ | 10 mS/cm | 12 mS/cm | 20 g |
| Example 37 | B | 0.10 g | a-6 | 24 | b-3 | 76 | — | 0 | — | 0 | $5.0 \times 10^5$ | 9 mS/cm | 14 mS/cm | 15 g |
| Example 38 | D | 0.05 g | a-1 | 14 | — | 0 | c-3 | 86 | — | 0 | $5.0 \times 10^5$ | 12 mS/cm | 14 mS/cm | 25 g |
| Example 39 | F | 0.10 g | a-1 | 25 | — | 0 | c-4 | 75 | — | 0 | $4.8 \times 10^5$ | 8 mS/cm | 10 mS/cm | 20 g |
| Example 40 | B | 0.10 g | a-3 | 28 | — | 0 | c-5 | 72 | — | 0 | $4.8 \times 10^5$ | 8 mS/cm | 8 mS/cm | 20 g |
| Example 41 | F | 0.10 g | a-5 | 30 | — | 0 | c-9 | 70 | — | 0 | $2.9 \times 10^5$ | 9 mS/cm | 9 mS/cm | 18 g |
| Example 42 | F | 0.06 g | a-8 | 35 | — | 0 | c-10 | 65 | — | 0 | $2.9 \times 10^5$ | 10 mS/cm | 12 mS/cm | 20 g |
| Example 43 | F | 0.06 g | a-8 | 15 | — | 0 | c-10 | 85 | — | 0 | $3.5 \times 10^5$ | 12 mS/cm | 14 mS/cm | 25 g |
| Example 44 | F | 0.06 g | a-1 | 8 | b-1 | 40 | c-1 | 52 | — | 0 | $3.1 \times 10^5$ | 14 mS/cm | 8 mS/cm | 20 g |
| Example 45 | F | 0.06 g | a-1 | 22 | b-1 | 33 | c-1 | 45 | — | 0 | $3.3 \times 10^5$ | 8 mS/cm | 10 mS/cm | 18 g |
| Example 46 | F | 0.10 g | a-3 | 33 | b-7 | 52 | c-1 | 15 | — | 0 | $4.0 \times 10^5$ | 9 mS/cm | 12 mS/cm | 20 g |
| Example 47 | F | 0.10 g | a-5 | 5 | b-7 | 43 | c-2 | 52 | — | 0 | $5.0 \times 10^5$ | 8 mS/cm | 11 mS/cm | 20 g |
| Example 48 | F | 0.10 g | a-6 | 8 | b-4 | 22 | c-2 | 50 | d-1 | 20 | $4.8 \times 10^5$ | 7 mS/cm | 9 mS/cm | 15 g |
| Example 49 | F | 0.10 g | a-8 | 26 | b-5 | 9 | c-2 | 30 | d-2 | 35 | $4.0 \times 10^5$ | 10 mS/cm | 10 mS/cm | 20 g |
| Example 50 | F | 0.10 g | a-8 | 22 | b-9 | 38 | c-2 | 25 | d-3 | 15 | $3.0 \times 10^5$ | 12 mS/cm | 8 mS/cm | 20 g |
| Example 51 | F | 0.10 g | a-12 | 33 | b-10 | 67 | — | 0 | — | 0 | $4.5 \times 10^5$ | 10 mS/cm | 9 mS/cm | 20 g |
| Example 52 | F | 0.10 g | a-12 | 27 | b-10 | 73 | — | 0 | — | 0 | $5.0 \times 10^5$ | 8 mS/cm | 10 mS/cm | 20 g |
| Example 53 | F | 0.10 g | a-14 | 35 | b-14 | 65 | — | 0 | — | 0 | $4.0 \times 10^5$ | 8 mS/cm | 12 mS/cm | 15 g |
| Example 54 | F | 0.10 g | 1–17 | 30 | — | 0 | c-1 | 70 | — | 0 | $3.0 \times 10^5$ | 9 mS/cm | 10 mS/cm | 20 g |
| Example 55 | F | 0.20 g | a-18 | 30 | — | 0 | c-3 | 70 | — | 0 | $3.0 \times 10^5$ | 9 mS/cm | 10 mS/cm | 25 g |
| Example 56 | F | 0.30 g | a-20 | 30 | — | 0 | c-10 | 70 | — | 0 | $3.0 \times 10^5$ | 8 mS/cm | 10 mS/cm | 20 g |
| Example 57 | F | 0.40 g | a-21 | 30 | b-10 | 50 | c-1 | 20 | — | 0 | $3.0 \times 10^5$ | 10 mS/cm | 8 mS/cm | 20 g |
| Example 58 | F | 0.10 g | a-22 | 25 | b-16 | 38 | c-3 | 37 | — | 0 | $3.0 \times 10^5$ | 12 mS/cm | 9 mS/cm | 18 g |
| Example 59 | F | 0.10 g | a-22 | 22 | b-3 | 26 | c-6 | 52 | — | 0 | $3.0 \times 10^5$ | 8 mS/cm | 11 mS/cm | 20 g |
| Example 60 | F | 0.10 g | a-24 | 5 | b-3 | 20 | c-10 | 75 | — | 0 | $3.0 \times 10^5$ | 8 mS/cm | 10 mS/cm | 18 g |
| Example 61 | F | 0.10 g | a-24 | 12 | b-3 | 6 | c-10 | 62 | d-1 | 20 | $3.0 \times 10^5$ | 9 mS/cm | 11 mS/cm | 20 g |
| Example 62 | F | 0.10 g | a-30 | 18 | b-3 | 4 | c-6 | 44 | d-2 | 34 | $3.0 \times 10^5$ | 9 mS/cm | 10 mS/cm | 20 g |
| Example 63 | F | 0.10 g | a-33 | 28 | b-10 | 35 | c-6 | 20 | d-3 | 17 | $3.0 \times 10^5$ | 10 mS/cm | 12 mS/cm | 15 g |
| Example 64 | F | 0.10 g | a-29 | 30 | — | 0 | — | 0 | d-3 | 70 | $3.0 \times 10^5$ | 12 mS/cm | 9 mS/cm | 20 g |
| Example 65 | F | 0.10 g | a-29 | 35 | — | 0 | — | 0 | d-4 | 65 | $3.0 \times 10^5$ | 10 mS/cm | 8 mS/cm | 20 g |
| Example 66 | F | 0.10 g | a-34 | 33 | — | 0 | — | 0 | d-4 | 67 | $3.0 \times 10^5$ | 8 mS/cm | 10 mS/cm | 20 g |
| Example 67 | F | 0.10 g | a-35 | 30 | — | 0 | — | 0 | d-5 | 70 | $3.0 \times 10^5$ | 9 mS/cm | 10 mS/cm | 20 g |
| Example 68 | F | 0.45 g | a-36 | 33 | — | 0 | — | 0 | d-5 | 67 | $3.0 \times 10^5$ | 8 mS/cm | 12 mS/cm | 18 g |
| Comparative Example 3 | F | 0.60 g | Methacrylic acid | 25 | — | 0 | — | 0 | d-2 | 75 | $5.5 \times 10^5$ | 2 mS/cm | 3 mS/cm | 2 g |
| Comparative Example 4 | F | 0.10 g | Methacrylic acid | 20 | — | 0 | — | 0 | d-2 | 80 | $5.8 \times 10^5$ | 2 mS/cm | 2 mS/cm | 4 g |
| Comparative Example 5 | F | 0.10 g | Methacrylic acid | 35 | — | 0 | — | 0 | d-2 | 65 | $5.3 \times 10^5$ | 2 mS/cm | 2 mS/cm | 3 g |

Copolymerization monomers used in the copolymer according to the invention shown in Table 2 are described below.

Monomer a: Monomer Forming the Monomer Unit Represented by Formula (A')

Example compounds a-1 to a-36 described hereinbefore

Monomer b: Styrene derivative

Example compounds b-1 to b-17 described hereinbefore

Monomer c: (Meth)acrylamide derivative

Example compounds c-1 to c-10 described hereinbefore

Monomer d: (Meth)acrylate d-1: Methyl acrylate d-2: Methyl methacrylate d-3: Ethyl methacrylate d-4: Isopropyl methacrylate d-5: n-Butyl methacrylate It can be seen from the results shown in Table 2 that the development latitude is considerably enlarged and the scratch resistance is also dominantly improved with the heat-sensitive lithographic printing plate precursors for Examples 32 to 68 according to the invention in comparison with the heat-sensitive lithographic printing plate precursors for Comparative Examples 3 to 5.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor comprising a support having thereon two image-forming layers each containing a polymer insoluble in water and soluble in an aqueous alkaline solution, wherein the upper layer of the image-forming layers contains a copolymer including a monomer unit represented by formula (A') shown below and an infrared absorbing dye, (A')

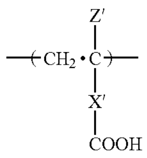

wherein Z' represents a hydrogen atom or an alkyl group, and X' represents an arylene group, which may have a substituent, or one of the structures represented by formulae (X2) and (X3) shown below, (X2)

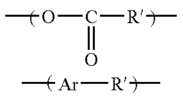

wherein Ar represents an arylene group, which may have a substituent, and R' represents a divalent connecting group.

2. The heat-sensitive lithographic printing plate precursor as claimed in claim 1, wherein the copolymer further contains a monomer unit derived from a monomer selected from a (meth)acrylate, a (meth)acrylamide derivative and a styrene derivative.

3. A heat-sensitive lithographic printing plate precursor comprising:

a support having thereon two image-forming layers each containing a polymer insoluble in water and soluble in an aqueous alkaline solution, wherein an upper layer of the image-forming layers contains a copolymer including a monomer unit represented by formula (A) shown below and a dissolution inhibiting compound, (A)

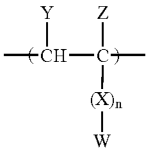

wherein W represents a carboxy group, X represents a divalent connecting group, Y represents a hydrogen atom or a carboxy group, Z represents a hydrogen atom, an alkyl group or a carboxy group, or W and Z or Y and Z may be combined with each other to form an acid anhydride group of —(CO)—O—(CO)—, and n represents 0 or 1.

* * * * *